United States Patent
Iguchi et al.

(10) Patent No.: US 11,496,138 B2
(45) Date of Patent: Nov. 8, 2022

(54) FREQUENCY STABILIZATION

(71) Applicant: Qualcomm Incorporated, San Diego, CA (US)

(72) Inventors: Shunta Iguchi, San Diego, CA (US); Xu Chi, San Diego, CA (US); Michael Naone Farias, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/365,783

(22) Filed: Jul. 1, 2021

(65) Prior Publication Data

US 2022/0006464 A1   Jan. 6, 2022

Related U.S. Application Data

(60) Provisional application No. 63/047,802, filed on Jul. 2, 2020.

(51) Int. Cl.

| | |
|---|---|
| *H03L 7/099* | (2006.01) |
| *G06F 1/04* | (2006.01) |
| *G06F 1/3287* | (2019.01) |
| *G06F 1/3206* | (2019.01) |
| *G06F 1/3296* | (2019.01) |
| *G06F 1/06* | (2006.01) |
| *G06F 1/08* | (2006.01) |
| *G06F 1/324* | (2019.01) |

(52) U.S. Cl.
CPC ............... *H03L 7/099* (2013.01); *G06F 1/04* (2013.01); *G06F 1/06* (2013.01); *G06F 1/08* (2013.01); *G06F 1/324* (2013.01); *G06F 1/3206* (2013.01); *G06F 1/3287* (2013.01); *G06F 1/3296* (2013.01)

(58) Field of Classification Search
CPC ..... G06F 1/06; G06F 1/04; G06F 1/10; G06F 1/324; G06F 1/3206; G06F 1/3287; G06F 1/3296; G06F 1/08; H03L 7/099
USPC .................................... 331/158, 175, 57, 74
See application file for complete search history.

(56) References Cited

U.S. PATENT DOCUMENTS

| | | | | |
|---|---|---|---|---|
| 6,137,374 | A * | 10/2000 | Merrill ................ | H03K 3/0307 331/74 |
| 8,299,864 | B2 * | 10/2012 | Tanaka .................... | H03L 1/022 331/116 R |
| 9,385,651 | B2 | 7/2016 | Zong et al. | |
| 9,673,755 | B1 | 6/2017 | Yavorskyy et al. | |
| 10,469,090 | B1 | 11/2019 | Zheng | |
| 2016/0028406 | A1 * | 1/2016 | Kobayashi ............ | H03K 3/011 331/57 |

(Continued)

*Primary Examiner* — Arnold M Kinkead
(74) *Attorney, Agent, or Firm* — Colby Nipper/Qualcomm

(57) ABSTRACT

An apparatus is disclosed for providing frequency stabilization. The apparatus includes a first supply voltage node, a second supply voltage node, an oscillator circuit coupled to the first supply voltage node, at least one clock buffer coupled to the second supply voltage node and an output of the oscillator circuit, and at least one load circuit. The at least one clock buffer is configured to selectively be in a disabled state or an enabled state to pass the clock signal to at least one client of multiple clients. The at least one load circuit includes an input coupled to the output of the oscillator circuit. The at least one load circuit also includes an output configured to be coupled to a ground. The at least one load circuit is configured to be connected to the first supply voltage node for at least a portion of time.

30 Claims, 11 Drawing Sheets

(56) References Cited

U.S. PATENT DOCUMENTS

| | | |
|---|---|---|
| 2017/0212399 A1 | 7/2017 | Tarng et al. |
| 2020/0091866 A1 | 3/2020 | Chao et al. |

\* cited by examiner

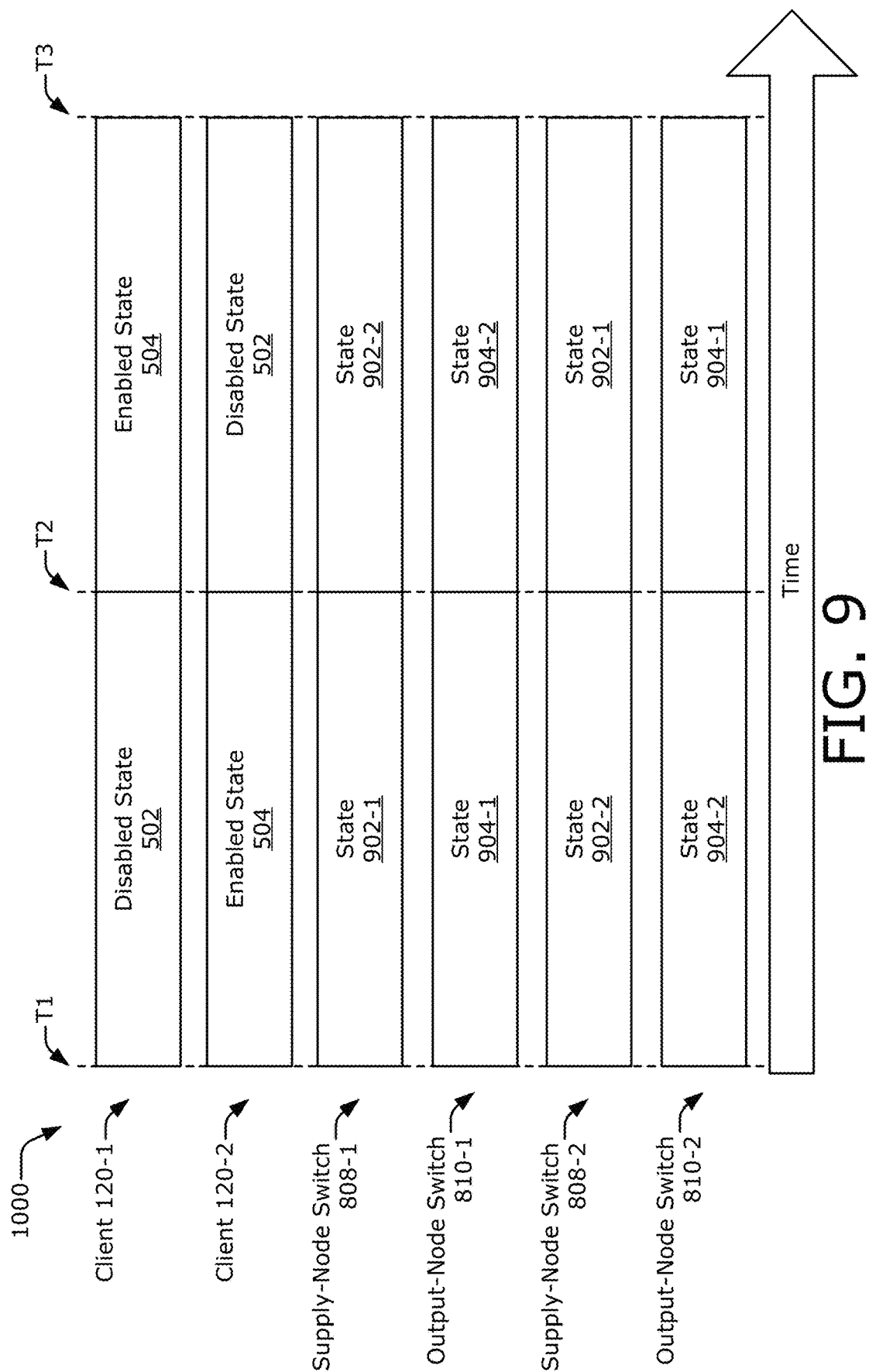

FREQUENCY STABILIZATION

CROSS-REFERENCE TO RELATED APPLICATION(S)

This application claims the benefit of U.S. Provisional Application No. 63/047,802, filed 2 Jul. 2020, the disclosure of which is hereby incorporated by reference in its entirety herein.

TECHNICAL FIELD

This disclosure relates generally to clock generation and, more specifically, to stabilizing a frequency of a clock signal.

BACKGROUND

Electronic devices use radio-frequency (RF) signals to communicate information. These radio-frequency signals enable users to talk with friends, download information, share pictures, remotely control household devices, receive global positioning information, employ radar for detection and tracking, listen to radio stations, and so forth. To generate these radio-frequency signals, an electronic device may include a clock generator, which generates a clock signal. The clock signal provides a stable frequency reference, which can be used by a transceiver to perform wireless communication. The clock signal may be provided, for example, to a mixer for frequency conversion (e.g., up-converting or down-converting communication signals) or to a phase-locked loop for generating another signal having a different stable frequency reference.

Due to a reliance upon the clock signal, any frequency errors or noise in the clock signal can directly impact communication quality and performance. Unfortunately, changes in operating conditions can introduce frequency shifts in the clock signal and reduce the frequency stability of the clock signal. Therefore, it can be challenging for the clock generator to achieve a target frequency accuracy across a variety of different operating conditions.

SUMMARY

Apparatuses and techniques are disclosed that implement frequency stabilization. In particular, a clock generator includes an oscillator circuit and a frequency stabilization circuit (e.g., load circuit), which are coupled to a same supply voltage. The oscillator circuit resonates at a particular frequency and uses the supply voltage to generate a clock signal. The frequency stabilization circuit adjusts an average of the supply voltage to stabilize the frequency of the clock signal for various loading conditions. In an enabled state, the frequency stabilization circuit operates as a load and draws power from the supply voltage, which changes the supply voltage by a small amount over a discontinuous sequence of time intervals. An amount of power drawn by the frequency stabilization circuit can be finely tuned to adjust the average of the supply voltage by a particular amount that directly compensates for frequency shifts caused by the different loading conditions. In this way, the frequency stabilization circuit can achieve a fine frequency-tuning resolution on the order of one or more parts per billion (ppb) (e.g., 1 ppb, 2 ppb, or 5 ppb). Furthermore, this fine frequency-tuning resolution can be achieved without significantly increasing a size of the clock generator, significantly increasing power consumption, or introducing additional phase noise.

In an example aspect, an apparatus is disclosed. The apparatus includes a first supply voltage node, a second supply voltage node, an oscillator circuit coupled to the first supply voltage node, at least one clock buffer coupled to the second supply voltage node and an output of the oscillator circuit, and at least one load circuit. The at least one clock buffer is configured to selectively be in a disabled state or an enabled state to pass the clock signal to at least one client of multiple clients. The at least one load circuit includes an input coupled to the output of the oscillator circuit. The at least one load circuit also includes an output configured to be coupled to a ground. The at least one load circuit is configured to be connected to the first supply voltage node for at least a portion of time.

In an example aspect, an apparatus is disclosed. The apparatus includes supply means for providing a supply voltage. The apparatus also includes oscillation means for generating a clock signal using the supply voltage. The apparatus additionally includes stabilization means for adjusting an average of the supply voltage by a particular amount. The stabilization means is coupled to the oscillation means, the supply means, and a ground.

In an example aspect, a method for providing frequency stabilization is disclosed. The method includes generating a clock signal using a supply voltage. The method also includes passing the clock signal to different sets of clients. The different sets of clients are associated with different loading conditions. The method additional includes adjusting an average of the supply voltage by different amounts based on the different loading conditions.

In an example aspect, an apparatus is disclosed. The apparatus includes multiple clients and a clock generator. Each client of the multiple clients is configured to selectively be in an enabled state or a disabled state; and accept a clock signal in accordance with the enabled state. The clock generator is coupled to the multiple clients and configured to generate the clock signal having a frequency that remains substantially stable responsive to providing the clock signal to a first set of the multiple clients that are in the enabled state during a first time interval and a second set of the multiple clients that are in the enabled state during a second time interval.

BRIEF DESCRIPTION OF DRAWINGS

FIG. 8-1 illustrates yet another example clock generator for frequency stabilization.

FIG. 8-2 illustrates an example clock buffer for frequency stabilization.

FIG. 9 illustrates an example state timing diagram for frequency stabilization using a clock buffer circuit, a supply-node switch circuit, and an output-node switch circuit.

DETAILED DESCRIPTION

Figure 1:
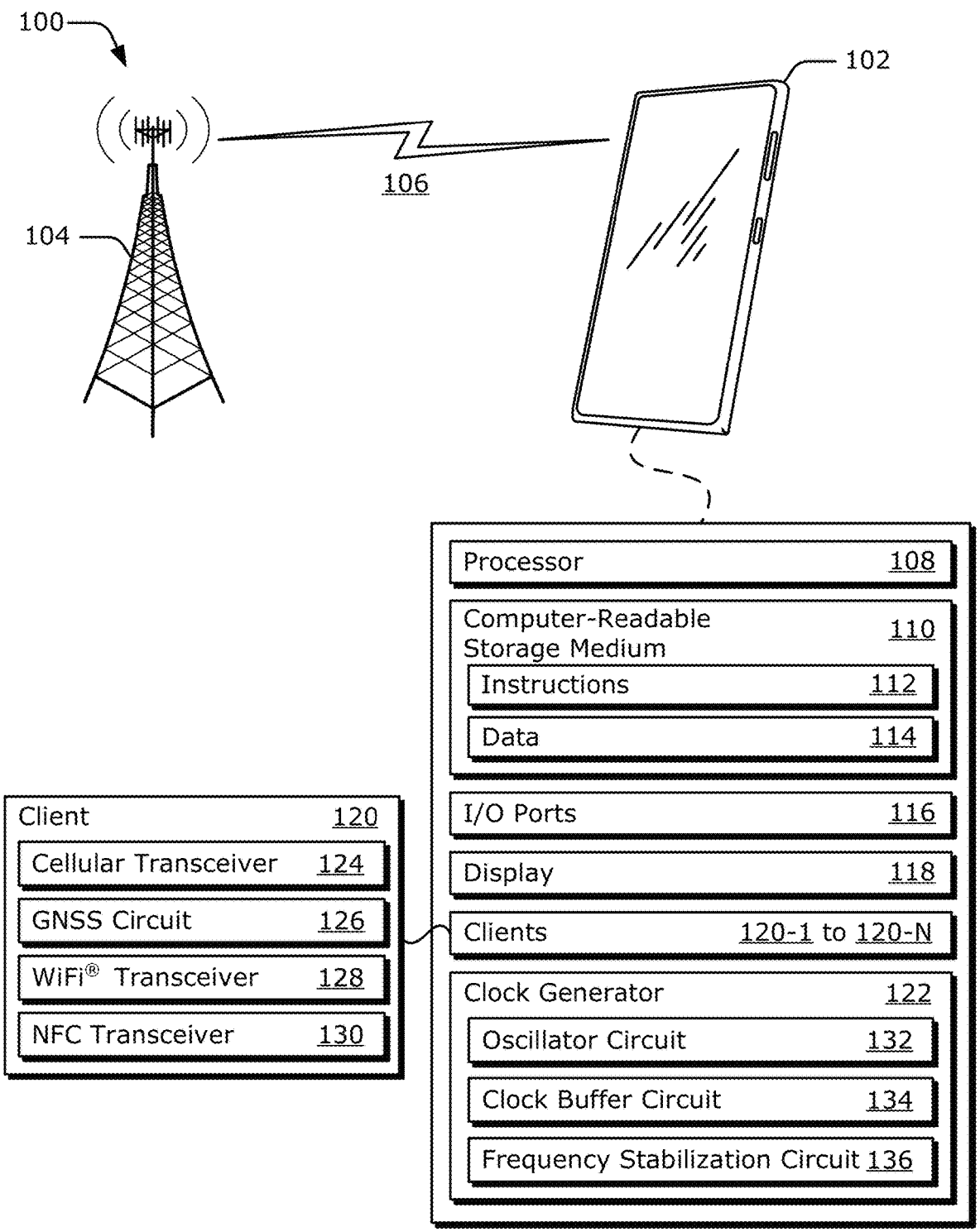
FIG. 1 illustrates an example operating environment for implementing frequency stabilization.

Electronic devices use clock generators to support radio-frequency communications or control synchronous circuitry. A clock generator generates a reference clock signal having a particular frequency. In general, the clock signal represents an invariant signal in which properties of the clock signal (e.g., frequency) remain relatively stable across time and operating conditions of the electronic device. This clock signal can be referenced by other components in the electronic device, including mixers, signal generators, phase-locked loops (PLLs), delay-locked loops (DLLs), clock distribution trees, clock domains, synchronous circuitries, and so forth. Due to a reliance on the clock signal, any frequency errors or noise in the clock signal can propagate to downstream circuit components and thereby impact performance of these circuit components.

Consider an example in which the clock signal is used by multiple clients, which can include a cellular transceiver, a Global Navigation Satellite System (GNSS) circuit or chip, a Wi-Fi® transceiver, a near-field communication (NFC) transceiver, and so forth. In some situations, these clients are independently enabled or disabled to conserve power. The enabling or disabling of these clients, however, can change the loading condition observed by the clock generator. Various loading conditions can introduce different frequency shifts in the clock signal and thereby reduce the frequency stability of the clock signal. This can make it challenging for the clock generator to achieve a target frequency accuracy for clients with strict frequency accuracy requirements, such as circuitry for using the GNSS circuit.

To address these issues and challenges, example approaches are described herein for frequency stabilization. An example apparatus includes a clock generator that can provide a clock signal to multiple clients. In some implementations, these clients can be independently enabled or disabled. In other words, different sets or combinations of clients may be enabled at any given time. Although dynamically enabling and disabling clients can facilitate power conservation within the apparatus, this causes the clock generator to observe different loading conditions as the clock signal is provided to different enabled clients or different sets of enabled clients.

The clock generator includes an oscillator circuit, a clock buffer circuit, and a frequency stabilization circuit (e.g., load circuit). The oscillator circuit and the frequency stabilization circuit are coupled to a same supply voltage. The oscillator circuit resonates at a particular frequency and uses the supply voltage to generate the clock signal. The clock buffer circuit passes the clock signal to the set of enabled clients.

The resonant frequency of the oscillator circuit is sensitive to changes in the supply voltage and changes in the loading condition. The changes in the loading condition, for example, can change the amount of inductive or capacitive coupling between the oscillator circuit and the clock buffer circuit. Left unchecked, different amounts of inductive or capacitive coupling can introduce different frequency shifts in the clock signal and therefore reduce the frequency stability of the clock signal. In some cases, the degraded frequency stability may be insufficient for certain clients, such as the GNSS circuit. Furthermore, due to size constraints of the clock generator, it can be challenging to provide additional isolation between the oscillator circuit and the clock buffer circuit.

To address these issues and challenges, the frequency stabilization circuit adjusts an average of the supply voltage to stabilize the frequency of the clock signal for various loading conditions. In an enabled state, the frequency stabilization circuit operates as a load and draws power from the supply voltage, which changes the supply voltage by a small amount over a discontinuous sequence of time intervals. An amount of power drawn by the frequency stabilization circuit can be finely tuned to adjust the average of the supply voltage by a particular amount that directly compensates for the change in the inductive or capacitive coupling. In this way, the frequency stabilization circuit can achieve a fine frequency-tuning resolution on the order of one or more parts per billion (ppb) (e.g., 1 ppb, 2 ppb, or 5 ppb). Furthermore, this fine frequency-tuning resolution can be achieved without significantly increasing a size of the clock generator, significantly increasing power consumption, or introducing additional phase noise.

FIG. 1 illustrates an example environment 100 for implementing frequency stabilization. In the environment 100, a computing device 102 communicates with a base station 104 through a wireless communication link 106 (wireless link 106). In this example, the computing device 102 is depicted as a smart phone. However, the computing device 102 can be implemented as any suitable computing or electronic device, such as a modem, a cellular base station, a broadband router, an access point, a cellular phone, a gaming device, a navigation device, a media device, a laptop computer, a desktop computer, a tablet computer, a wearable computer, a server, a network-attached storage (NAS) device, a smart appliance or other internet of things (IoT) device, customer premises equipment (CPE), a medical device, a vehicle-based communication system, a radar, a radio apparatus, and so forth.

The base station 104 communicates with the computing device 102 via the wireless link 106, which can be implemented as any suitable type of wireless link. Although depicted as a tower of a cellular network, the base station 104 can represent or be implemented as another device, such as a satellite, a server device, a terrestrial television broadcast tower, an access point, a peer-to-peer device, a mesh network node, CPE, a smartphone or handset, and so forth. Therefore, the computing device 102 may communicate with the base station 104 or another device via a wireless connection.

The wireless link 106 can include a downlink of data or control information communicated from the base station 104 to the computing device 102, an uplink of other data or control information communicated from the computing device 102 to the base station 104, or both a downlink and an uplink. The wireless link 106 can be implemented using any suitable communication protocol or standard, such as 2nd-generation (2G), 3rd-generation (3G), 4th-generation (4G), or 5th-generation (5G) cellular; IEEE 802.11 (e.g., Wi-Fi®); IEEE 802.15 (e.g., Bluetooth®); IEEE 802.16 (e.g., WiMAX®); and so forth. In some implementations, the wireless link 106 may wirelessly provide power and the base station 104 may comprise a power source.

As shown, the computing device 102 includes a processor 108 and a computer-readable storage medium 110 (CRM 110). The processor 108 may be an application processor and/or a processor associated with a modem of the computing device 102, or may be any other type of processor of the computing device 102. For example, the processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 can also include input/output ports 116 (I/O ports 116) and a display 118. The I/O ports 116 enable data exchanges or interaction with other devices, networks, or users. The I/O ports 116 can include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternatively or additionally, the display 118 can be implemented as a display port or virtual interface, through which graphical content of the computing device 102 is presented.

The computing device 102 also includes multiple clients 120-1 to 120-N and at least one clock generator 122, where N represents a positive integer. The clock generator 122 can provide a same clock signal to one or more of the clients 120-1 to 120-N at a given time. The clients 120-1 to 120-N utilize the clock signal to perform an operation. For example, the clients 120-1 to 120-N can include various types of wireless transceivers with one or more components that utilize the clock signal. These components can include mixers, signal generators, phase-locked loops, delay-locked loops, and so forth. The clock signal can additionally or alternatively be used for timing operations of synchronous logic. Example clients include a cellular transceiver 124 (which is also referred to as a wireless wide-area network (WWAN) transceiver), a GNSS circuit 126, a Wi-Fi® transceiver 128, or a near-field communication (NFC) transceiver 130. Other example clients can include a Bluetooth™ transceiver, a radar sensor, an ultrasonic sensor, or a radio.

Generally speaking, the clock generator 122 generates the clock signal without referencing another clock signal. This differs from other signal generating components, like phase-locked loops, that use the clock signal from the clock generator 122 to generate other versions of the clock signal that have different frequencies. As such, the clock signal that is generated by the clock generator 122 is a reference clock signal having a quality that can impact the performance of many different parts of the computing device 102.

The clock generator 122 includes at least one oscillator circuit 132, at least one clock buffer circuit 134, and at least one frequency stabilization circuit 136. In some implementations, at least a portion of the frequency stabilization circuit 136 can be integrated within the clock buffer circuit 134, as further described with respect to FIG. 8-1. In an example aspect, at least a portion of the oscillator circuit 132, the clock buffer circuit 134, and the frequency stabilization circuit 136 are implemented on an integrated circuit. A resonator of the oscillator circuit 132 can be implemented on a printed circuit board (PCB) and coupled to the integrated circuit.

The oscillator circuit 132 generates the clock signal and the clock buffer circuit 134 selectively passes the clock signal (or a signal based on the clock signal) to one or more of the clients 120-1 to 120-N. The clock buffer circuit 134 additionally provides isolation between the oscillator circuit 132 and the clients 120-1 to 120-N.

The frequency stabilization circuit 136, at least partially, provides frequency stabilization for the clock generator 122. In particular, the frequency stabilization circuit 136 enables a frequency of the clock signal to remain substantially stable (e.g., relatively unchanged) under various loading conditions as the clock signal is passed to different sets of the clients 120-1 to 120-N. In other words, a frequency of the clock signal can remain substantially the same as the clock signal is passed to a first client 120-1 during a first time interval, passed to a second client 120-2 during a second time interval, or passed to the first client 120-1 and the second client 120-2 during a third time interval. The term substantially stable can refer to the frequency of the clock signal shifting less than a highest target frequency accuracy of the clients 120-1 to 120-N. For example, the frequency of the clock signal can be stabilized such that any frequency shift is approximately 5 ppb or less (e.g., 2 ppb or 1 ppb). The oscillator circuit 132, the clock buffer circuit 134, and the frequency stabilization circuit 136 are further described with respect to FIG. 2.

Figure 2:
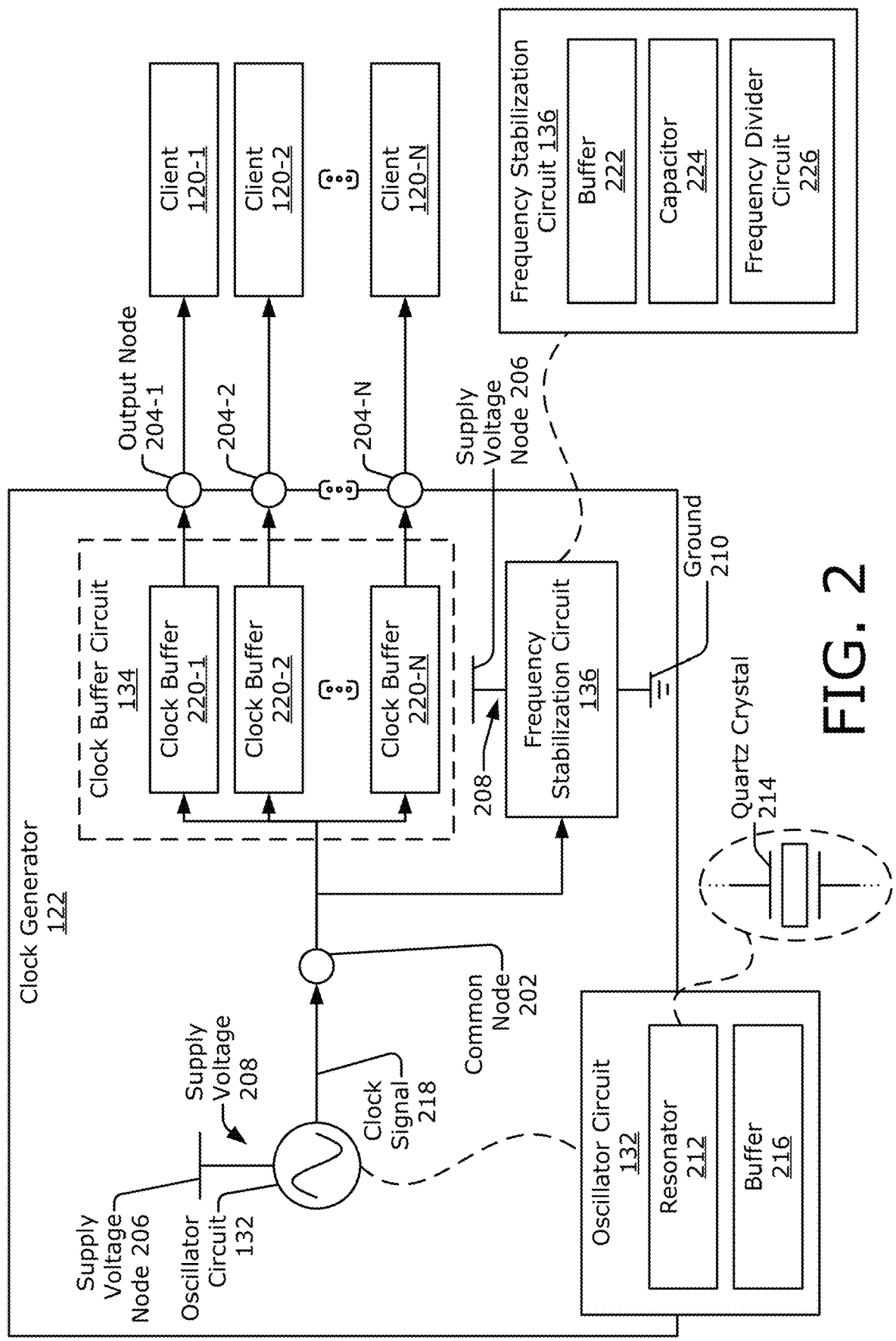
FIG. 2 illustrates an example clock generator coupled to example clients for frequency stabilization.

FIG. 2 illustrates an example clock generator 122 coupled to example clients 120-1 to 120-N. In the depicted configuration, the clock generator 122 includes the oscillator circuit 132, the clock buffer circuit 134, and the frequency stabilization circuit 136. The clock generator 122 also includes a common node 202 and output nodes 204-1 to 204-N. The common node 202 is coupled to an output of the oscillator circuit 132, an input of the clock buffer circuit 134, and an input of the frequency stabilization circuit 136. The output nodes 204-1 to 204-N are respectively coupled to the clients 120-1 to 120-N.

The oscillator circuit 132 and the frequency stabilization circuit 136 are coupled to a same supply voltage node 206. Although not explicitly shown, the clock buffer circuit 134 can be coupled to a different supply voltage node (not shown). The supply voltage node 206 provides a supply voltage 208 to the oscillator circuit 132 and the frequency stabilization circuit 136. An output of the frequency stabilization circuit 136 is coupled to a ground 210. The ground 210 can be a local ground of an integrated circuit that implements at least a portion of the clock generator 122 or a ground on a printed circuit board that is coupled to the clock generator 122.

The oscillator circuit 132 includes at least one resonator 212 (e.g., as few as one resonator), such as a quartz crystal 214. In other implementations, the resonator 212 can include an inductor-capacitor (LC) resonator, a resonator transistor (e.g., a bipolar junction transistor (BJT), a junction gate field-effect transistor (JFET), a metal-oxide semiconductor field-effective transistor (MOSFET), or a gallium arsenide field-effect transistor (GaAsFET)), a transmission line, a diode, a piezoelectric oscillator, multiple quartz crystals 214, multiple resonators 212, and so forth. The resonator 212 resonates at a particular frequency, which can vary based on the supply voltage 208 and/or loading conditions of the clock generator 122 (e.g., inductive and/or capacitive coupling observed by the oscillator circuit 132). Although not shown, the oscillator circuit 132 can also include at least one oscillator (not shown), such as a voltage-mode oscillator, a current-mode oscillator, or a combination thereof. The oscillator is coupled to the resonator 212 and includes a power circuit and an amplification circuit to cause the resonator 212 to resonate. In some implementations, the resonator 212 is implemented on a printed circuit board and the other components of the oscillator circuit 132 and/or other components of the clock generator 122 are implemented on an integrated circuit.

The oscillator circuit 132 can optionally include a buffer 216 coupled between the resonator 212 and the common node 202. The buffer 216 can provide some additional isolation between the resonator 212 and other components of the clock generator 122. In this way, the buffer 216 can reduce the sensitivity of the oscillator circuit 132 to changes in the loading conditions. The buffer 216 can also provide amplification. During operation, the oscillator circuit 132 generates a clock signal 218, which passes through the common node 202 to the clock buffer circuit 134 and the frequency stabilization circuit 136.

The clock buffer circuit 134 includes clock buffers 220-1 to 220-N, which are respectively coupled to the output nodes 204-1 to 204-N. The clock buffers 220-1 to 220-N provide isolation between the oscillator circuit 132 and the clients 120-1 to 120-N. Additionally, the clock buffers 220-1 to 220-N can convert the clock signal 218 from a sinusoidal signal to a square-wave signal.

During operation, each clock buffer 220-1 to 220-N can operate in an enabled state or a disabled state in accordance with an operational state of the associated client 120-1 to 120-N. In general, each clock buffer 220-1 to 220-N operates in the enabled state responsive to its corresponding client 120-1 to 120-N operating in the enabled state (e.g., a powered-on state). Likewise, each clock buffer 220-1 to 220-N operates in the disabled state responsive to its corresponding client 120-1 to 120-N operating in the disabled state (e.g., a powered-down state). In the enabled state, the clock buffers 220-1 to 220-N accept the clock signal 218 and pass the clock signal 218 to the corresponding client 120-1 to 120-N. In the disabled state, the clock buffers 220-1 to 220-N prevent the clock signal 218 from passing to the corresponding client 120-1 to 120-N.

The enabling and disabling of the clock buffers 220-1 to 220-N responsive to the changing loading conditions (e.g., changing set of enabled clients 120-1 to 120-N) can change the inductive and capacitive coupling between the oscillator circuit 132 and the clock buffer circuit 134. Consequently, the oscillator circuit 132 observes changes in the inductive or capacitive coupling as individual clock buffers 220-1 to 220-N are enabled or disabled in accordance with its corresponding client 120-1 to 120-N being enabled or disabled. Although the dynamic enabling and disabling of the clock buffers 220-1 to 220-N and clients 120-1 to 120-N can conserve power, the changes in the capacitive or inductive coupling can introduce frequency shifts within the clock signal 218, which degrades the frequency stability of the clock signal 218 if left unchecked.

The frequency stabilization circuit 136 can accommodate the changing capacitive and inductive coupling to stabilize the frequency of the clock signal 218. The frequency stabilization circuit 136 may include at least one buffer 222 and at least one capacitor 224. The buffer 222 can have a fixed or variable size. The capacitor 224 can have a fixed capacitance or a variable capacitance. The frequency stabilization circuit 136 can also optionally include a frequency divider circuit 226.

In the enabled state, the frequency stabilization circuit 136 accepts the clock signal 218 and operates as a load (e.g., a dummy load), which draws power from the supply voltage node 206. Characteristics of the buffer 222 and the capacitor 224 can be designed to draw (e.g., pull) a particular amount of current from the supply voltage node 206 in order to draw a particular amount of power. This current is generated based on a period of the clock signal 218. By generating this current, the frequency stabilization circuit 136 can adjust (e.g., decrease) a magnitude of the supply voltage 208 for at least a portion of each period of the clock signal 218.

Because the frequency at which the resonator 212 resonates is sensitive to changes in the supply voltage 208, the adjustment to the supply voltage 208 can compensate for the frequency shift introduced by the present loading condition. The frequency stabilization circuit 136 can dynamically change the adjusted magnitude of the supply voltage 208 to provide frequency stabilization across various loading conditions.

As shown in FIG. 2, the frequency stabilization circuit 136 is persistently disconnected from all of the clients 120-1 to 120-N and persistently connected to the supply voltage node 206 and the ground 210. In other words, the frequency stabilization circuit 136 is not directly connected to the output nodes 204-1 to 204-N (or pins) of the clock generator 122 (or integrated circuit that implements a portion of the clock generator 122).

Figures 1, 8:
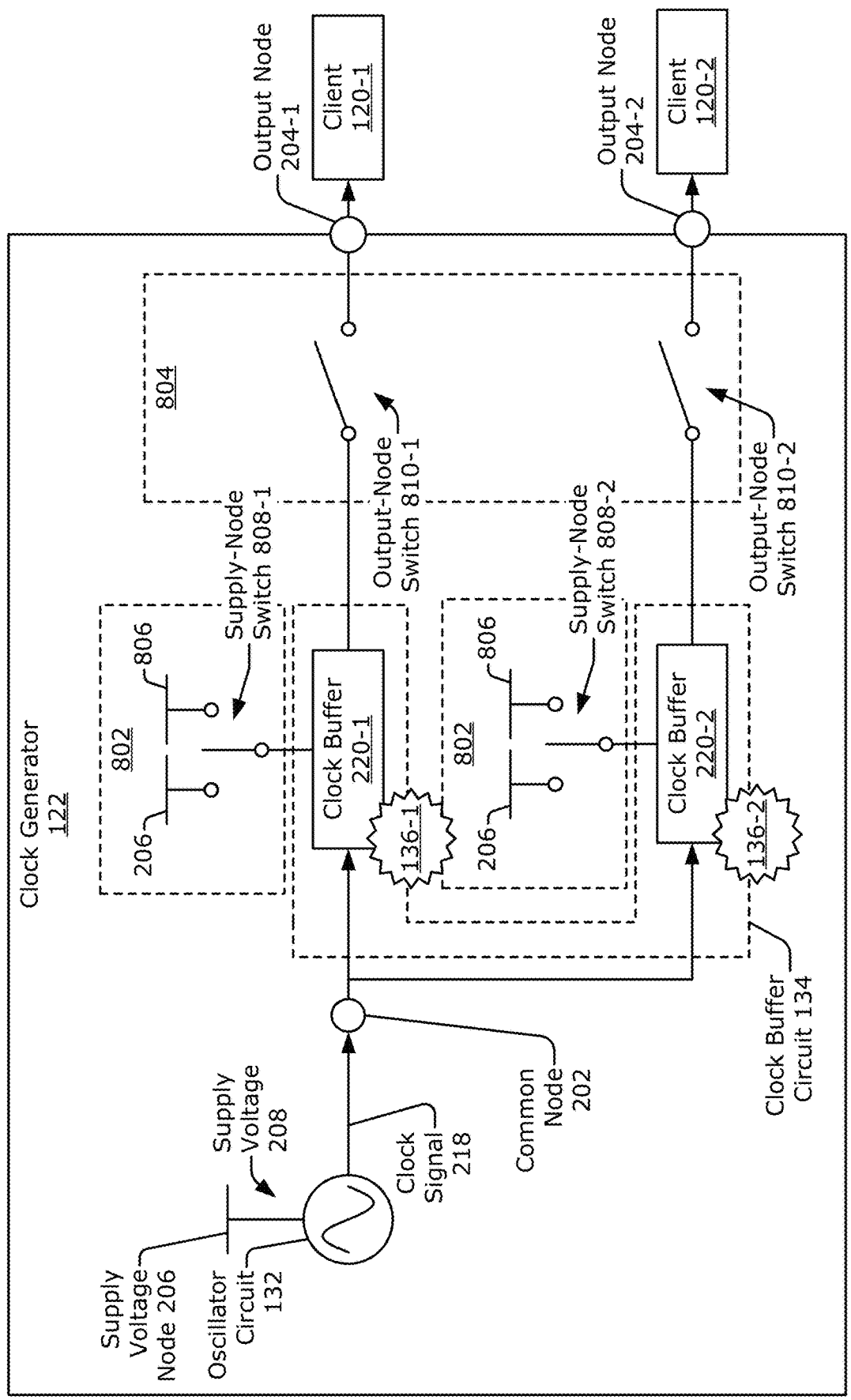
Figures 2, 8:
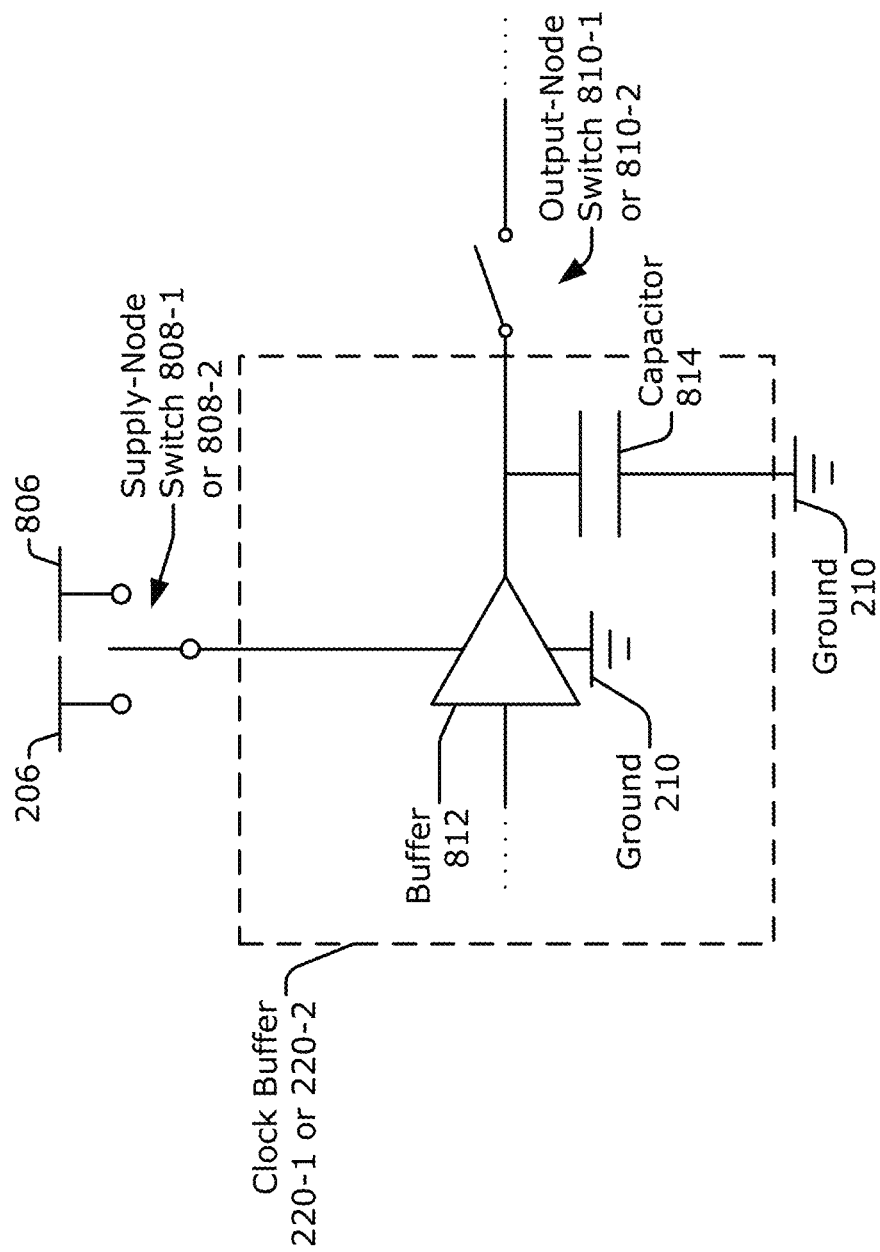

In other implementations, the frequency stabilization circuit 136 can be fully or partially integrated within the clock buffer circuit 134. In particular, one or more of the clock buffers 220 (alone and/or in combination with one or more other elements) may be configured to perform the adjustment of the supply voltage 208, either instead of the frequency stabilization circuit 136 or in addition thereto. In such embodiments, one or more switches may be configured to selectively disconnect an output of a clock buffer 220 from its respective client 120, as further described with respect to FIGS. 8-1 and 8-2. An output of the frequency stabilization circuit 136 may therefore be disconnected from an output of the clock generator 122 and/or from any client (e.g., the clients 120) either permanently (e.g., persistently) (as shown in FIG. 2) or selectively (as shown in FIG. 8-1).

As used herein, "couple," "coupled," or "coupling" refers to a relationship between two or more components that are in operative communication magnetically, electromagnetically, or by being electrically connected to implement some feature or realize some capability that is described. The term "connect," "connected," or "connecting" refers to an electrical connection using a physical line, such as a metal trace or wire. In some cases, an electrical connection can include a resistor, a capacitor, an inductor, a transistor, and so forth. A connection can include a direct connection or an indirect connection. A direct connection refers to connecting discrete circuit elements via a same node without an intervening element. An indirect connection refers to connecting discrete circuit elements via one or more other devices or other discrete circuit elements. The terms "direct" and "indirect" may also modify or otherwise be applied to "coupling." Operation of the frequency stabilization circuit 136 is further described with respect to FIG. 3.

Figure 3:
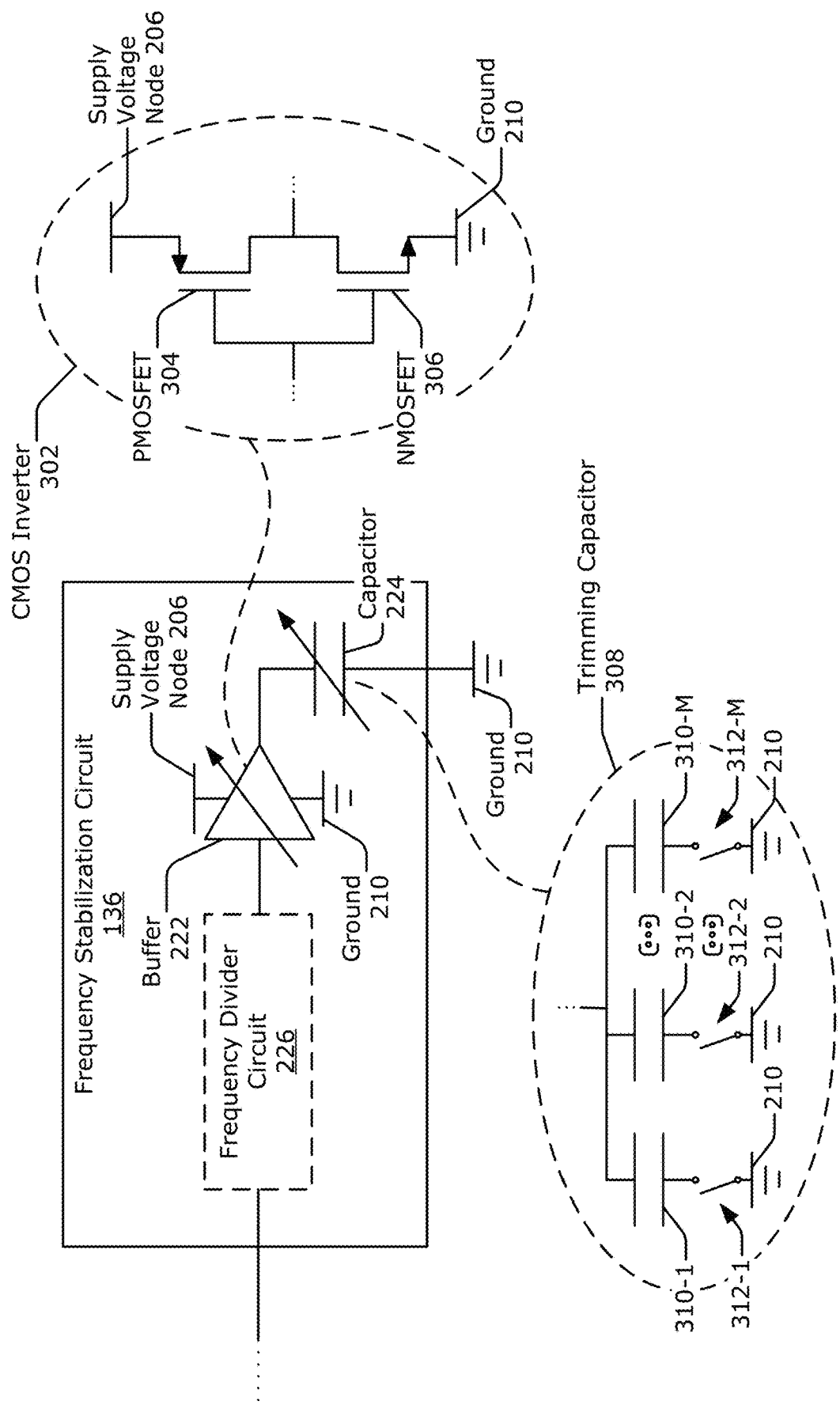
FIG. 3 illustrates an example frequency stabilization circuit for frequency stabilization.

FIG. 3 illustrates an example frequency stabilization circuit 136. In the depicted configuration, the buffer 222 is coupled between the common node 202 and the capacitor 224. The buffer 222 is also coupled to the supply voltage node 206 and the ground 210. The capacitor 224 is coupled between an output of the buffer 222 and the ground 210. In implementations that include the frequency divider circuit 226, the frequency divider circuit 226 is coupled between the common node 202 and an input of the buffer 222.

The buffer 222 can be implemented using a complementary metal-oxide-semiconductor (CMOS) invertor 302, which includes a p-type metal-oxide-semiconductor field-effect transistor (PMOSFET) 304 and an n-type metal-oxide-semiconductor field-effect transistor (NMOSFET)

306 coupled in series between the supply voltage node 206 and the ground 210. Gate terminals of the PMOSFET 304 and the NMOSFET 306 are coupled together to the common node 202 or the frequency divider circuit 226. Drain terminals of the PMOSFET 304 and the NMOSFET 306 are coupled together to the capacitor 224.

In some implementations, the frequency stabilization circuit 136 can include multiple buffers 222 (e.g., multiple CMOS inverters 302) coupled together in parallel. Using multiple buffers 222, the frequency stabilization circuit 136 can adjust the amount of power that is drawn from the supply voltage node 206 (e.g., the amount of current that flows from the supply voltage node 206 to the capacitor 224 or to respective capacitors) by changing the quantity of buffers 222 that operate in the enabled state. For example, the frequency stabilization circuit 136 can increase power consumption by increasing the quantity of buffers 222 that operate in the enabled state and decrease power consumption by decreasing the quantity of buffers 222 that operate in the enabled state.

The capacitor 224 can be implemented using a trimming capacitor 308 (e.g., a variable capacitor), which includes multiple capacitors 310-1 to 310-M and multiple switches 312-1 to 312-M, where M represents a positive integer. The capacitors 310-1 to 310-M are coupled to respective switches 312-1 to 312-M and form respective branches. The branches are coupled in parallel between the buffer 222 and the ground 210. The trimming capacitor 308 has a variable capacitance, which can be adjusted by adjusting the quantity of capacitors 310-1 to 310-M that are coupled together in parallel (e.g., by adjusting the quantity of switches 312-1 to 312-M that are closed). In general, increasing the capacitance of the trimming capacitor 308 increases the amount of power that is drawn from the supply voltage node 206 and decreasing the capacitance of the trimming capacitor 308 decreases the amount of power that is drawn from the supply voltage node 206.

In some implementations, the frequency stabilization circuit 136 provides frequency stability for multiple loading conditions (e.g., compensates for different amounts of frequency shifting caused by different sets of the clock buffers 220-1 to 220-N being enabled). In this case, the buffer 222 can have a variable size and/or the capacitor 224 can have a variable capacitance. To realize this flexibility, the frequency stabilization circuit can dynamically change the size of the buffer 222 (e.g., the quantity of buffers 222 that are enabled in parallel) and/or the capacitance of the capacitor 224.

In other implementations, the frequency stabilization circuit 136 provides frequency stability for a loading condition associated with a particular clock buffer 220-1 to 220-N (e.g., compensates for a particular amount of frequency shifting). In this case, multiple frequency stabilization circuits 136 can be coupled to the common node 202 and each frequency stabilization circuit 136 can be designed to compensate for the particular frequency shift introduced by its respective clock buffer 220-1 to 220-N. As such, each frequency stabilization circuit 136 is enabled or disabled in accordance with its associated clock buffer 220-1 to 220-N being enabled or disabled, as further described with respect to FIGS. 6 and 7. The amount of power drawn by the frequency stabilization circuit 136 over time can adjust an average of the supply voltage 208, as further described with respect to FIG. 4.

The frequency stabilization circuit 136 is not limited to the configuration illustrated in FIG. 3, nor is the frequency stabilization circuit 136 limited to including a buffer. For example, the frequency stabilization circuit 136 may include any set of one or more components, wherein at least one of those components is coupled to the supply voltage node 206, configured to adjust (e.g., increase or decrease) a magnitude of the supply voltage 208.

Figure 4:
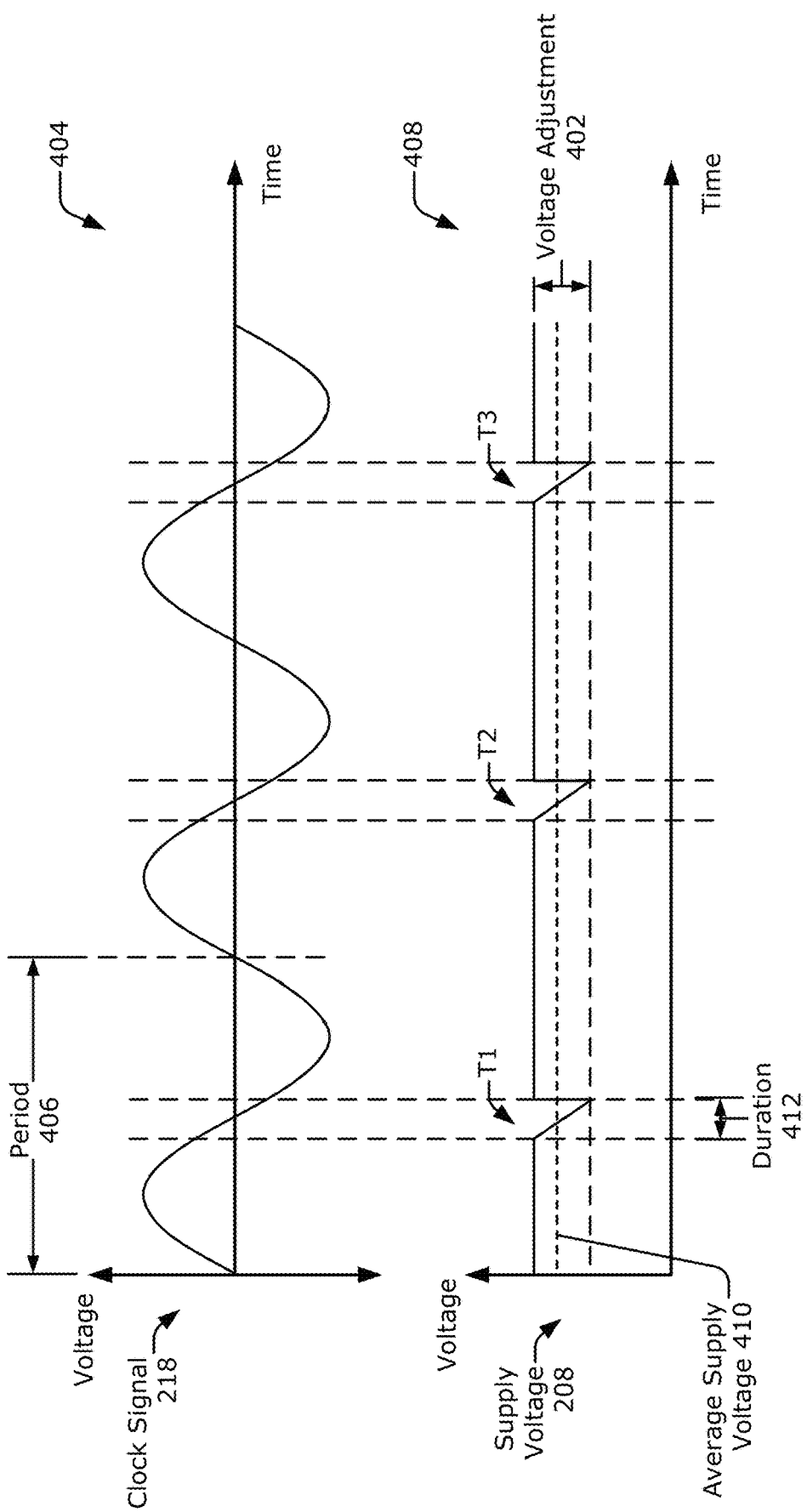
FIG. 4 illustrates an example voltage adjustment to a supply voltage for frequency stabilization.

FIG. 4 illustrates an example voltage adjustment 402 to the supply voltage 208 for frequency stabilization. A first graph 404 illustrates a voltage of the clock signal 218 over time. The voltage of the clock signal 218 can vary between a voltage at the ground 210 and the supply voltage 208. As shown in the graph 404, the clock signal 218 is a sinusoidal signal with a period 406. This clock signal 218 is provided as an input to the buffer 222 (e.g., an input of the CMOS inverter 302 of FIG. 3).

A second graph 408 illustrates a magnitude of the supply voltage 208 over time. The frequency stabilization circuit 136 causes the supply voltage 208 to decrease over discontinuous time intervals. This effectively decreases an average of the supply voltage 208 (e.g., an average supply voltage 410) over the period 406 of the clock signal 218, as further described below.

During a portion of the period 406, the voltage of the clock signal 218 causes the PMOSFET 304 of the CMOS inverter 302 to be enabled (e.g., turned on or operate in the triode or saturation region) and the NMOSFET 306 of the CMOS inverter 302 to be disabled (e.g., turned off or be in the cutoff region). This allows a current to flow through the PMOSFET 304 from the supply voltage node 206 to the capacitor 224. This current charges the capacitor 224. This causes the supply voltage 208 to decrease by an amount represented by the voltage adjustment 402. The decrease in the supply voltage 208 occurs throughout a duration 412 in which the capacitor 224 is charged through the PMOSFET 304. The voltage adjustment 402 shown during the time interval T1 can repeat for subsequent periods of the clock signal 218, such as during time intervals T2 and T3. In this manner, the voltage adjustment 402 occurs at discontinuous time intervals associated with a portion of the period 406 of the clock signal 218.

During another portion of the period 406, the voltage of the clock signal 218 causes the PMOSFET 304 to be disabled and the NMOSFET 306 to be enabled. This enables the capacitor 224 to be discharged. In particular, the capacitor 224 generates another current that flows through the NMOSFET 306 to the ground 210.

The magnitude of the voltage adjustment 402 is based on the size of the buffer 222 and the capacitance of the capacitor 224. Therefore, different configurations of the frequency stabilization circuit 136 can cause a larger voltage adjustment 402 or a smaller voltage adjustment 402 to occur. As an example, the voltage adjustment 402 can be on the order of millivolts (mV) (e.g., −1 mV, −2 mV, −5 mV, or −10 mV). The duration 412 of the voltage adjustment 402 is a fraction of the period 406, such as 1/10 of the period 406. Consider an example in which the voltage adjustment 402 is −10 mV and the duration 412 is 1/10 of the period 406. This results in the average supply voltage 410 decreasing by 1 mV relative to a voltage of the supply voltage 208 during a time period that is outside of the time intervals T1 and T2.

As described above, the voltage adjustment 402 to the supply voltage 208 shifts the frequency of the oscillator circuit 132. Consider an example in which the oscillator circuit 132 has a sensitivity that results in a frequency shift of −5 parts per million (ppm) for each one volt increase in the average supply voltage 410. Continuing with the previous example, an average voltage adjustment of −1 mV over the period 406 results in a +5 ppb frequency shift to the clock signal 218.

The frequency at which the voltage adjustment 402 occurs can be adjusted using the frequency divider circuit 226. As described above, the voltage adjustments 402 occur every period of the clock signal 218 if the frequency divider circuit 226 is bypassed, disabled, or not implemented. By enabling the frequency divider circuit 226, however, the voltage adjustments 402 can occur at multiples of the period of the clock signal 218.

In more detail, the frequency divider circuit 226 generates a modified version of the clock signal 218, which is provided at the input to the buffer 222 instead of the clock signal 218. The frequency divider circuit 226 causes the modified version of the clock signal 218 to have a longer period (e.g., a smaller frequency) than the clock signal 218. Consider an example in which the frequency divider circuit 226 generates the modified version of the clock signal 218 with a frequency that is half a frequency of the clock signal 218 (e.g., with a period that is twice the period 406). This causes the voltage adjustments 402 to occur every other period 406 of the clock signal 218 (e.g., at time T1 and T3 but not at time T2). With the ability to control the frequency of the voltage adjustments 402, the average supply voltage 410 can be further tuned to yield a particular frequency shift in the clock signal 218.

Figure 5:
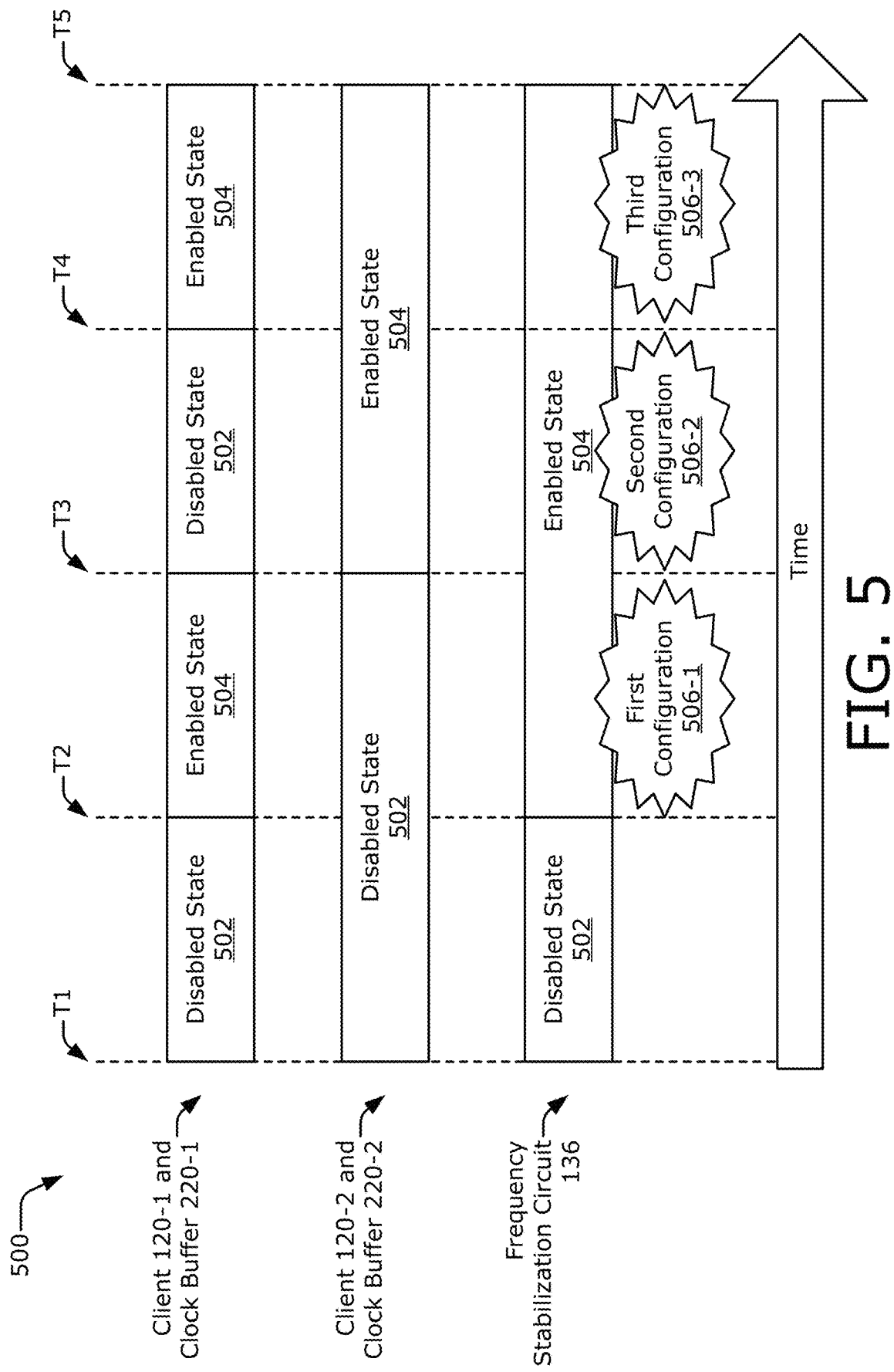
FIG. 5 illustrates an example state timing diagram for frequency stabilization using a single frequency stabilization circuit.
Figure 7:
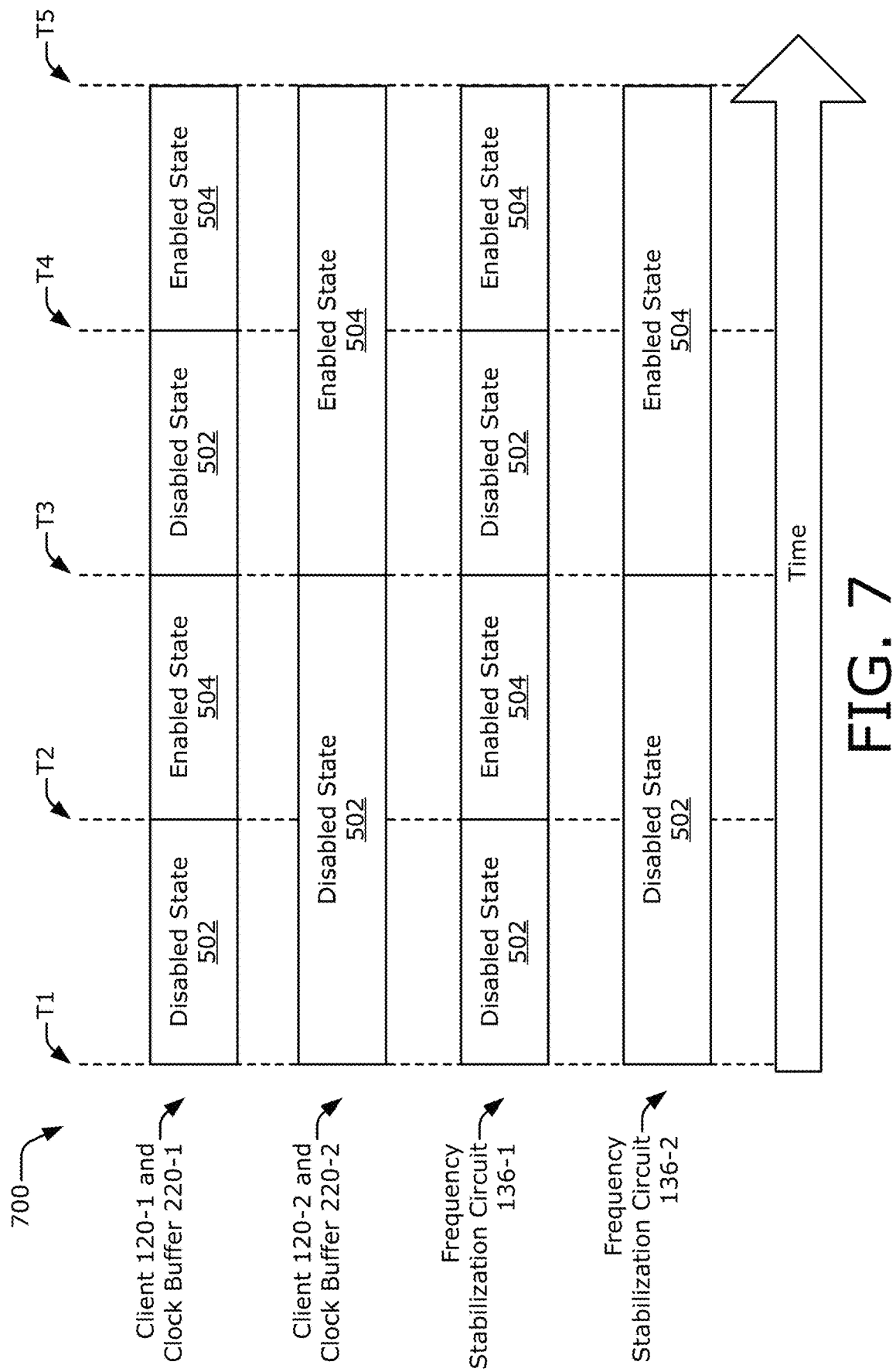
FIG. 7 illustrates an example state timing diagram for frequency stabilization using multiple frequency stabilization circuits.

As further described in FIGS. 5 and 7, the frequency stabilization circuit 136 can dynamically compensate for different amounts of frequency shifting caused by different loading conditions. To realize this flexibility, an individual frequency stabilization circuit 136 can operate according to different configurations. These different configurations can change the size of the buffer 222 and/or the capacitance of the capacitor 224 to cause the frequency stabilization circuit 136 to realize different voltage adjustments 402. Additionally or alternatively, different combinations of frequency stabilization circuits 136 can be enabled at a given time.

FIG. 5 illustrates an example state timing diagram 500 for frequency stabilization using a single frequency stabilization circuit 136, with time elapsing to the right. In the depicted example, the clock generator 122 (of FIG. 2) includes two clock buffers 220-1 and 220-2, which are coupled to respective clients 120-1 and 120-2. The clients 120-1 and 120-2 and the clock buffers 220-1 and 220-2 can be in a disabled state 502 or an enabled state 504. In the disabled state, the client 120-1 or 120-2 is powered down and the clock buffer 220-1 or 220-2 prevents the clock signal 218 from being passed to the client 120-1 or 120-2. In the enabled state 504, the client 120-1 or 120-2 is powered on and the clock buffer 220-1 or 220-2 passes the clock signal 218 or a signal based thereon to the client 120-1 or 120-2. The operational state of the clock buffers 220-1 and 220-2 can be controlled by the corresponding client 120-1 and 120-2 or by the processor 108.

The frequency stabilization circuit 136 can also operate in the disabled state 502 or the enabled state 504. In the disabled state 502, the frequency stabilization circuit 136 does not consume power (e.g., the PMOSFET 304 and the NMOSFET 306 of the CMOS inverter 302 are disabled). In the enabled state 504, the frequency stabilization circuit 136 accepts the clock signal 218 and consumes power to adjust the supply voltage 208. While in the enabled state 504, the frequency stabilization circuit 136 can also selectively operate according to one or more configurations. Each configuration causes the frequency stabilization circuit 136 to adjust the supply voltage 208 by a different amount. In this way, the frequency stabilization circuit 136 can shift the frequency of the clock signal 218 by different amounts for different loading conditions.

For example, the frequency stabilization circuit 136 can selectively operate in a first configuration 506-1 to adjust the average supply voltage 410 by a first amount, operate in a second configuration 506-2 to adjust the average supply voltage 410 by a second amount, or operate in a third configuration 506-3 to adjust the average supply voltage 410 by a third amount. In this example, the first configuration 506-1 stabilizes the frequency of the clock signal 218 for a first loading condition in which the clock signal 218 is provided to the first client 120-1. The second configuration 506-2 stabilizes the frequency of the clock signal 218 for a second loading condition in which the clock signal 218 is provided to the second client 120-2. The third configuration 506-3 stabilizes the frequency of the clock signal 218 for a third loading condition in which the clock signal 218 is provided to the first client 120-1 and the second client 120-2. The operational state and configuration of the frequency stabilization circuit 136 can be controlled by the processor 108 or based on state information provided by the clients 120-1 to 120-2 or the clock buffers 220-1 to 220-2.

Between time T1 and time T2 in the state timing diagram 500, the clients 120-1 and 120-2 and the clock buffers 220-1 and 220-2 are in the disabled state 502. In this situation, the frequency stabilization circuit 136 is also in the disabled state 502 to conserve power.

Between time T2 and time T3, the client 120-1 and the clock buffer 220-1 are in the enabled state 504. Additionally, the client 120-2 and the clock buffer 220-2 are in the disabled state 502. To compensate for the frequency shift caused by the client 120-1 and the clock buffer 220-1 being in the enabled state 504, the frequency stabilization circuit 136 operates in the enabled state 504 according to the first configuration 506-1.

Between time T3 and time T4, the client 120-1 and the clock buffer 220-1 are in the disabled state 502. Additionally, the client 120-2 and the clock buffer 220-2 are in the enabled state 504. To compensate for another frequency shift caused by the client 120-2 and the clock buffer 220-2 being in the enabled state 504, the frequency stabilization circuit 136 operates in the enabled state 504 according to the second configuration 506-2. In this way, the frequency of the clock signal 218 can remain substantially stable (e.g., unchanged) from time T1 to time T4.

Between time T4 and time T5, the clients 120-1 and 120-2 and the clock buffers 220-1 and 220-2 are in the enabled state 504. To compensate for yet another frequency shift caused by the clients 120-1 and 120-2 and the clock buffers 220-1 and 220-2 being in the enabled state 504, the frequency stabilization circuit 136 operates in the enabled state 504 according to the third configuration 506-3. In this way, the frequency of the clock signal 218 can remain substantially stable from time T1 to time T5.

Although not shown, other timing situations are also possible. For example, the frequency stabilization circuit 136 can be in the enabled state 504 while the clients 120-1 and 120-2 and the clock buffers 220-1 and 220-2 are in the disabled state 502 and can be in the disabled state 502 during another time that one or both of the clients 120-1 and 120-2 are enabled.

Figure 6:
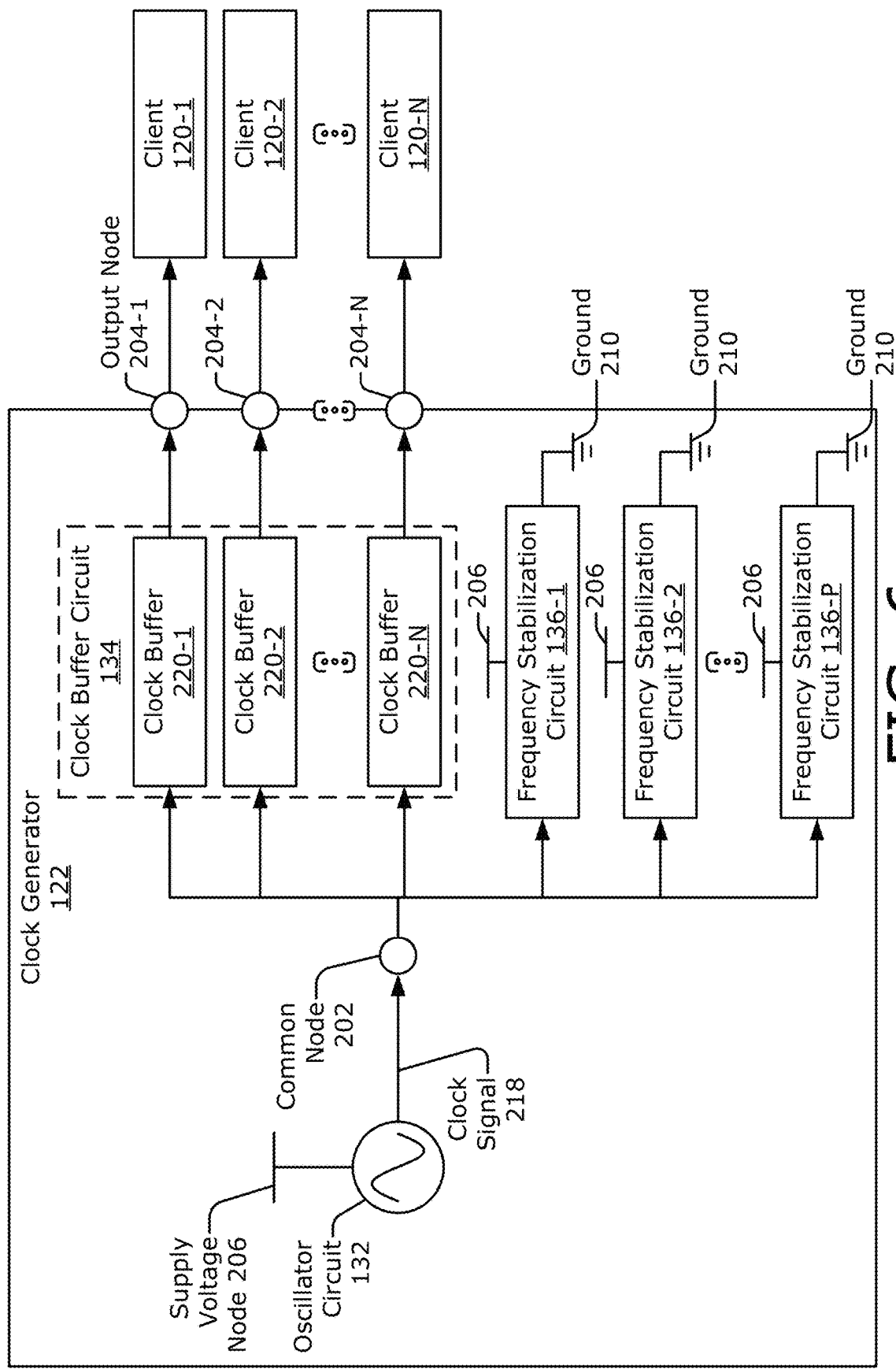
FIG. 6 illustrates another example clock generator with multiple frequency stabilization circuits for frequency stabilization.

FIG. 6 illustrates another example clock generator 122 with multiple frequency stabilization circuits 136-1 to 136-P for frequency stabilization. The quantity of frequency stabilization circuits (P) can be equal to or different than the quantity of clock buffers (N). The frequency stabilization circuits 136-1 to 136-P are coupled to the supply voltage node 206. Additionally, the inputs of the frequency stabilization circuits 136-1 to 136-P are coupled to the common node 202. The outputs of the frequency stabilization circuits are coupled to the ground 210. In the depicted configuration, the frequency stabilization circuits 136-1 to 136-P are persistently disconnected from all of the clients 120-1 to 120-N and persistently connected to the supply voltage node 206 and the ground 210. In other words, the frequency stabilization circuit 136 is not directly connected to the output nodes 204-1 to 204-N of the clock generator 122.

The frequency stabilization circuits 136-1 to 136-P can have buffers 222 with similar or different sizes and capacitors 224 with similar or different capacitances. Differences between the sizes of the buffers 222 or the capacitances of the capacitors 224 enables the frequency stabilization circuits 136-1 to 136-P to adjust the supply voltage 208 by different amounts to realize different average supply voltages 410. In an example implementation in which the quantity of frequency stabilization circuits 136-1 to 136-P is equal to the quantity of clock buffers 220-1 to 220-N (e.g., P is equal to N), each frequency stabilization circuit 136-1 to 136-P can be tailored to provide frequency stabilization for a corresponding clock buffer 220-1 to 220-N, as further described with respect to FIG. 7.

FIG. 7 illustrates an example state timing diagram 700 for frequency stabilization using two frequency stabilization circuits 136-1 and 136-2, with time elapsing to the right. In the depicted example, the clock generator 122 (of FIG. 6) includes two clock buffers 220-1 and 220-2, which are coupled to respective clients 120-1 and 120-2. The clients 120-1 and 120-2, the clock buffers 220-1 and 220-2, and the frequency stabilization circuits 136-1 and 136-2 can be in the disabled state 502 or the enabled state 504, as described above. The frequency stabilization circuit 136-1 can stabilize the frequency of the clock signal 218 while the clock buffer 220-1 is in the enabled state 504. Likewise, the frequency stabilization circuit 136-2 can stabilize the frequency of the clock signal 218 while the clock buffer 220-2 is in the enabled state 504. The operational states of the frequency stabilization circuits 136-1 and 136-2 can be controlled by the processor 108 or based on the state information provided by the clients 120-1 to 120-2 or the clock buffers 220-1 to 220-2.

Between time T1 and time T2 in the state timing diagram 700, the clients 120-1 and 120-2 and the clock buffers 220-1 and 220-2 are in the disabled state 502. In this situation, the frequency stabilization circuits 136-1 and 136-2 are also in the disabled state 502 to conserve power.

Between time T2 and time T3, the client 120-1 and the clock buffer 220-1 are in the enabled state 504. Additionally, the client 120-2 and the clock buffer 220-2 are in the disabled state 502. To compensate for the frequency shift caused by the client 120-1 and the clock buffer 220-1 being in the enabled state 504, the frequency stabilization circuit 136-1 operates in the enabled state 504. Because the client 120-2 and the clock buffer 220-2 are in the disabled state 502, the frequency stabilization circuit 136-2 is also in the disabled state 502.

Between time T3 and time T4, the client 120-1 and the clock buffer 220-1 are in the disabled state 502. Additionally, the client 120-2 and the clock buffer 220-2 are in the enabled state 504. To compensate for another frequency shift caused by the client 120-2 and the clock buffer 220-2 being in the enabled state 504, the frequency stabilization circuit 136-2 operates in the enabled state 504. Because the client 120-1 and the clock buffer 220-1 are in the disabled state 502, the frequency stabilization circuit 136-1 is also in the disabled state 502.

Between time T4 and time T5, the clients 120-1 and 120-2 and the clock buffers 220-1 and 220-2 are in the enabled state 504. To compensate for yet another frequency shift caused by the clients 120-1 and 120-2 and the clock buffers 220-1 and 220-2 being in the enabled state 504, the frequency stabilization circuits 136-1 and 136-2 operate in the enabled state 504. By enabling or disabling the frequency stabilization circuit 136-1 and 136-2 in accordance with the states of the corresponding clock buffers 220-1 and 220-2 and clients 120-1 and 120-2, the frequency of the clock signal 218 can remain substantially stable from time T1 to time T5.

FIG. 8-1 illustrates yet another example clock generator 122. In this example, the frequency stabilization circuit 136 is integrated within the clock buffer circuit 134. In particular, at least one of the clock buffers 220 within the clock buffer circuit 134 can selectively operate as the clock buffer or the frequency stabilization circuit 136.

In the depicted configuration, the clock generator 122 includes output nodes 204-1 and 204-2, which are respectively coupled to the clients 120-1 and 120-2. The clock generator 122 also includes a supply-node switch circuit 802 and an output-node switch circuit 804. The clock buffer circuit 134 includes the clock buffers 220-1 and 220-2. The clock buffers 220-1 and 220-2 can include similar components as the frequency stabilization circuit 136 (of FIG. 3), as further described with respect to FIG. 8-2.

The supply-node switch circuit 802 selectively connects portions of the clock buffer circuit 134 to the supply voltage node 206 or another supply voltage node 806. The supply voltage node 206 and the other supply voltage node 806 are isolated from each other. In this way, operations of components coupled to the supply voltage node 806 do not significantly impact the supply voltage 208 at the supply voltage node 206. The other supply voltage node 806 provides another supply voltage to the clock buffer circuit 134, which can be different than the supply voltage 208 provided by the supply voltage node 206. Although not explicitly shown in FIGS. 2 and 6, the clock buffers 220-1 to 220-N can be coupled to this supply voltage node 806 in those figures. The supply-node switch circuit 802 includes supply-node switches 808-1 and 808-2, which are respectively coupled to the clock buffers 220-1 and 220-2. The supply-node switches 808-1 and 808-2 can be implemented as single-pole double-throw switches. Each of the supply-node switches 808-1 and 808-2 selectively connects the corresponding clock buffer 220-1 or 220-2 to the supply voltage node 206 or 806.

The output-node switch circuit 804 can selectively connect portions of the clock buffer circuit 134 to the ground 210 or the output nodes 204-1 to 204-N. In particular, the output-node switch circuit 804 includes output-node switches 810-1 and 810-2. The output-node switches 810-1 and 810-2 can be implemented as single-pole single-throw switches. The output-node switch 810-1 can selectively connect an output of the clock buffer 220-1 to the ground 210 or the output node 204-1. Likewise, the output-node switch 810-2 can selectively connect an output of the clock buffer 220-2 to the ground 210 or the output node 204-2.

During operation, the clock buffer 220-1 can selectively operate as the frequency stabilization circuit 136-1 and/or the clock buffer 220-2 can selectively operate as the frequency stabilization circuit 136-2. To enable the clock buffer 220-1 to operate as the frequency stabilization circuit 136-1, the supply-node switch 808-1 and the output-node switch 810-1 are in a first state (e.g., respective states 902-1 and 904-1 of FIG. 9). In particular, the supply-node switch circuit 802 connects the clock buffer 220-1 to the supply voltage node 206 and disconnects the clock buffer 220-1 from the supply voltage node 806 using the supply-node switch 808-1. Also, the output-node switch circuit 804 disconnects the output of the clock buffer 220-1 from the output node 204-1 using the output-node switch 810-1.

To enable the clock buffer 220-2 to operate as the frequency stabilization circuit 136-2, the supply-node switch 808-2 and the output-node switch 810-2 are in the first state (e.g., respective states 902-1 and 904-1 of FIG. 9). In particular, the supply-node switch circuit 802 connects the clock buffer 220-2 to the supply voltage node 206 and disconnects the clock buffer 220-2 from the supply voltage node 806 using the supply-node switch 808-2. Also, the output-node switch circuit 804 disconnects the output of the clock buffer 220-2 from the output node 204-2 using the output-node switch 810-2.

To enable the clock buffer 220-1 to pass the clock signal 218 to the client 120-1, the supply-node switch 808-1 and the output-node switch 810-1 are in a second state (e.g., respective states 902-2 and 904-2 of FIG. 9). In particular, the supply-node switch circuit 802 connects the clock buffer 220-1 to the supply voltage node 806 and disconnects the clock buffer 220-1 from the supply voltage node 206 using the supply-node switch 808-1. Also, the output-node switch circuit 804 connects the output of the clock buffer 220-1 to the output node 204-1 using the output-node switch 810-1.

To enable the clock buffer 220-2 to pass the clock signal 218 to the client 120-2, the supply-node switch 808-2 and the output-node switch 810-2 are in the second state (e.g., respective states 902-2 and 904-2 of FIG. 9). In particular, the supply-node switch circuit 802 connects the clock buffer 220-2 to the supply voltage node 806 and disconnects the clock buffer 220-2 from the supply voltage node 206 using the supply-node switch 808-2. Also, the output-node switch circuit 804 connects the output of the clock buffer 220-2 to the output node 204-2 using the output-node switch 810-2.

With the supply-node switch circuit 802 and the output-node switch circuit 804, the clock buffer circuit 134 can selectively provide, at least partially, frequency stabilization for the clock generator 122 in addition to or as an alternative to using a dedicated frequency stabilization circuit 136 as shown in FIGS. 2 and 6. The clock buffer 220-1 or 220-2 is further described with respect to FIG. 8-2.

FIG. 8-2 illustrates an example implementation of the clock buffer 220-1 or 220-2 for frequency stabilization. In the depicted configuration, the clock buffer 220-1 or 220-2 includes at least one buffer 812 and at least one capacitor 814. The buffer 812 can be implemented as a CMOS inverter, such as the CMOS inverter 302 of FIG. 3. An input of the buffer 812 is coupled to the common node 202. The buffer 812 is also coupled to the supply-node switch 808-1 or 808-2 and the ground 210. An output of the buffer 812 is coupled to the capacitor 814 and the output-node switch 810-1.

The capacitor 814 can have a fixed or variable capacitance. As an example, the capacitor 814 can be implemented using a trimming capacitor, such as the trimming capacitor 308 of FIG. 3. The capacitor 814 is coupled between the output of the buffer 812 and the ground 210.

As described above with respect to FIG. 8-1, the output-node switch 810-1 or 810-2 selectively connects the output of the buffer 812 to the corresponding client 120-1 or 120-2 or disconnects the output of the buffer 812 from the corresponding client 120-1 or 120-2. Also, the supply-node switch 808-1 or 808-2 selectively connects the clock buffer 220-1 or 220-2 to the supply voltage node 206 or the supply voltage node 806. Operations of the supply-node switch circuit 802 and the output-node switch circuit 804 are further described with respect to FIG. 9.

FIG. 9 illustrates an example state timing diagram 900 for frequency stabilization using the clock buffer circuit 134, the supply-node switch circuit 802, and the output-node switch circuit 804 of FIG. 8-1, with time elapsing to the right. In the depicted example, the clock generator 122 (of FIG. 8-1) includes two clock buffers 220-1 and 220-2, which are coupled to respective clients 120-1 and 120-2. The clients 120-1 and 120-2 can be in the disabled state 502 or the enabled state 504, as described above. In this example, the clock buffers 220-1 and 220-2 are in the enabled state 504 from time T1 to time T3. Although not explicitly shown, the clock buffers 220-1 and 220-2 can be in the disabled state 502 if the clients 120-1 and 120-2 are in the disabled state 502, or if a different configuration is used in which one or more of the clock buffers 220 are not coupled to a client 120.

The clock buffer 220-1 can stabilize the frequency of the clock signal 218 while the client 120-1 is in the disabled state 502 and the client 120-2 is in the enabled state 504. Likewise, the clock buffer 220-2 can stabilize the frequency of the clock signal 218 while the client 120-2 is in the disabled state 502 and the client 120-1 is in the enabled state 504. The operational states of the supply-node switch circuit 802 and the output-node switch circuit 804 can be controlled by the processor 108 or based on the state information provided by the clients 120-1 to 120-2 or the clock buffers 220-1 to 220-2.

Between time T1 and time T2, the client 120-1 is in the disabled state 502 and the client 120-2 is in the enabled state 504. To enable the clock buffer 220-1 to operate as the frequency stabilization circuit 136-1, the supply-node switch 808-1 is in the state 902-1, which connects the clock buffer 220-1 to the supply voltage node 206. Also, the output-node switch 810-1 is in the state 904-1, which disconnects the output of the clock buffer 220-1 from the output node 204-1. The clock buffer 220-2 passes the clock signal 218 or a signal based thereon to the client 120-2 based on the supply-node switch 808-2 being in the state 902-2, which connects the clock buffer 220-2 to the supply voltage node 806. Also, the output-node switch 810-2 is in the state 904-2, which connects the output of the clock buffer 220-2 to the output node 204-2. In this way, the clock buffer 220-1 can compensate for the frequency shift caused by the client 120-2 and the clock buffer 220-2 being in the enabled state 504.

Between time T2 and time T3, the client 120-2 is in the disabled state 502 and the client 120-1 is in the enabled state 504. To enable the clock buffer 220-2 to operate as the frequency stabilization circuit 136-2, the supply-node switch 808-2 is in the state 902-1, which connects the clock buffer 220-2 to the supply voltage node 206. Also, the output-node switch 810-2 is in the state 904-1, which disconnects the output of the clock buffer 220-2 from the output node 204-2. The clock buffer 220-1 passes the clock signal 218 or a signal based thereon to the client 120-1 based on the supply-node switch 808-1 being in the state 902-1, which connects the clock buffer 220-1 to the supply voltage node 806. Also, the output-node switch 810-1 is in the state 904-1, which connects the output of the clock buffer 220-1 to the output node 204-1. In this way, the clock buffer 220-2 can compensate for the frequency shift caused by the client 120-1 and the clock buffer 220-1 being in the enabled state 504.

Although not shown, other implementations can enable frequency stabilization during time intervals in which the clients 120-1 and 120-2 are in the enabled state. In this case, a dedicated frequency stabilization circuit 136 (e.g., of FIG. 2 or 6) can compensate for the frequency shift caused by the clients 120-1 and 120-2 being in the enabled state 504. Alternatively, another clock buffer 220 can compensate for the frequency shift caused by the clients 120-1 and 120-2 being in the enabled state 504 while its corresponding client 120 is in the disabled state 502. In some implementations, a circuit which can be used as either a clock buffer 220 or a frequency stabilization circuit 136 is not coupled to a client 120. For example, when there are more clock buffers 220 than clients 120, one of the clock buffers 220 may be configured as a frequency stabilization circuit 136 using the switches 808 and 810. In general, any combination of the implementations of FIGS. 2, 6, and 8-1 can be used to provide frequency stabilization.

Figure 10:
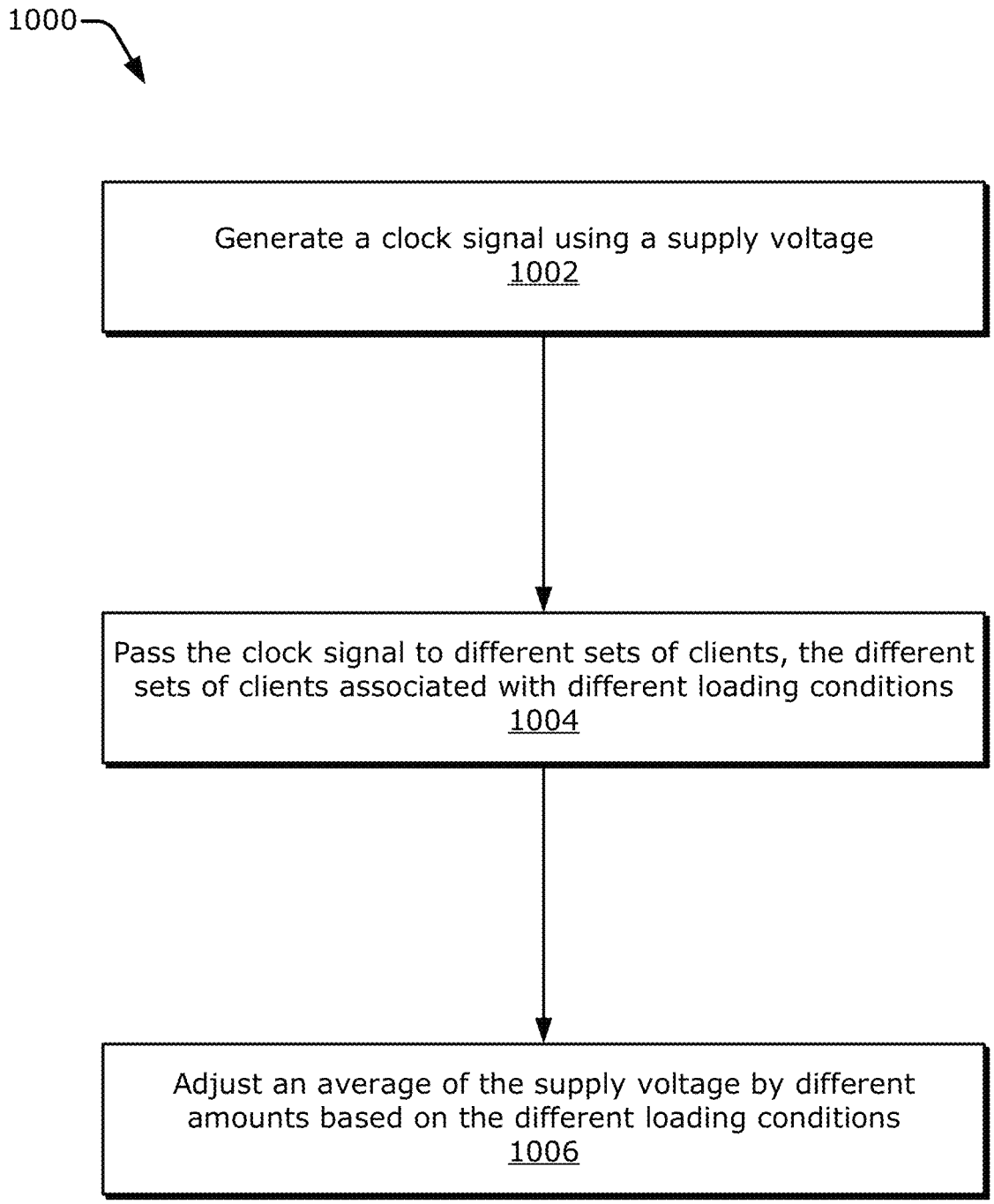
FIG. 10 is a flow diagram illustrating an example process for providing frequency stabilization.

FIG. 10 is a flow diagram illustrating an example process for providing frequency stabilization. The process 1000 is described in the form of a set of blocks 1002-1006 that specify operations that can be performed. However, operations are not necessarily limited to the order shown in FIG. 10 or described herein, for the operations may be implemented in alternative orders or in fully or partially overlapping manners. Also, more, fewer, and/or different operations may be implemented to perform the process 1000, or an alternative process. Operations represented by the illustrated blocks of the process 1000 may be performed by a clock generator 122 (e.g., of FIG. 1, 2, 6, or 8). More specifically, the operations of the process 1000 may be performed, at least in part, by the frequency stabilization circuit 136 (e.g., a load circuit) shown in FIG. 3, the clock buffer 220 shown in FIG. 8-2, or some combination thereof.

At block 1002, a clock signal is generated using a supply voltage. For example, the oscillator circuit 132 generates the clock signal 218 using the supply voltage 208 provided by the supply voltage node 206. The oscillator circuit 132 can generate the clock signal 218 using as few as one resonator 212.

At block 1004, the clock signal is passed to different sets of clients. The different sets of clients (wherein a set can include one or more clients) are associated with different loading conditions. For example, the clock buffer circuit 134 passes the clock signal 218 to different sets of the clients 120-1 to 120-N, which are associated with different loading conditions. For example, the clock buffer circuit 134 passes the clock signal 218 to a first client during a first time interval. In particular, the clock buffer 220-1 is in the enabled state 504 to pass the clock signal 218 to the first client 120-1 during the time interval T2 to T3 in FIG. 5, 7, or 9.

As another example, the clock buffer circuit 134 passes the clock signal 218 to a second client 120-2 during a second time interval. In particular, the clock buffer 220-2 is in the enabled state 504 to pass the clock signal 218 to the second client 120-2 during the time interval T3 to T4 in FIG. 5 or 7 or during the time interval T1 to T2 in FIG. 9.

As yet another example, the clock buffer circuit 134 passes the clock signal 218 to the clients 120-1 and 120-2 during a third time interval. In particular, the clock buffers 220-1 and 220-2 are in the enabled state 504 to pass the clock signal 218 to the first client 120-1 and the second client 120-2 during the time interval T4 to T5 in FIG. 5 or 7.

At block 1010, an average of the supply voltage is adjusted by different amounts based on the different loading conditions. For example, the frequency stabilization circuit 136 adjusts the average supply voltage 410 by different amounts based on the different loading conditions. In one implementation, the frequency stabilization circuit 136 can adjust a size of the buffer 222 and/or a capacitance of the capacitor 224 by various amounts to adjust the average of the supply voltage 410. In another implementation, different combinations of the frequency stabilization circuits 136-1 to 136-P are enabled to adjust the average supply voltage 410 by different amounts. In yet another implementation, the switch circuits 802 and 804 cause different combinations of clock buffers 220 to operate as frequency stabilization circuits 136 to adjust the average supply voltage 410 by different amounts. By adjusting the average supply voltage 410 by different amounts, the frequency stabilization circuit 136 and/or the clock buffer 220 cause the clock signal 218 to have a substantially same frequency during the different loading conditions.

In one example, the frequency stabilization circuit 136 can operate according to different configurations during different loading conditions to adjust the supply voltage 208 by different amounts, as described above with respect to FIG. 5. In another example, different sets of multiple frequency stabilization circuits 136 can be enabled at a given time to adjust the supply voltage 208 by different amounts, as described above with respect to FIG. 7. In yet another example, some combination of enabling different sets of the multiple frequency stabilization circuits 136 and operating one or more of these frequency stabilization circuits 136 according to different configurations can be used to adjust the supply voltage 208 by different amounts.

In another example, the switch circuits 802 and 804 cause different combinations of clock buffers 220 to operate as frequency stabilization circuits 136 to adjust the average supply voltage 410 by different amounts. Additionally or alternatively, one or more of the clock buffers 220 can operate according to different configurations to adjust the supply voltage 208 by different amounts, similar to the frequency stabilization circuit 136.

The state and/or configuration of the one or more frequency stabilization circuits 136 and/or clock buffers 220 can be determined based on a control signal provided by the processor 108, state information provided by the clock buffer circuit 134 (e.g., information about whether the clock buffers 220-1 and 220-2 are in the enabled state 504, the disabled state 502, or some combination thereof), or state information provided by the clients 120-1 to 120-N (e.g., information about whether the clients 120-1 and 120-2 are in the enabled state 504, the disabled state 502, or some combination thereof). An example process may include the processor 108 generating control signals to control operation of the clock generator 122 or performing operations that cause elements of the mobile device 102 (such as those elements mentioned in the description of FIG. 10) to perform the operations described in blocks 1002-1006.

Some aspects describing certain configurations pursuant to the concepts described herein are included below.

Aspect 1: An apparatus comprising:
a first supply voltage node;
a second supply voltage node;
an oscillator circuit coupled to the first supply voltage node and configured to generate a clock signal;

at least one clock buffer coupled to the second supply voltage node and an output of the oscillator circuit, the at least one clock buffer configured to selectively be in:
  a disabled state; or
  an enabled state to pass the clock signal to at least one client of multiple clients; and
at least one load circuit comprising:
  an input coupled to the output of the oscillator circuit; and
  an output configured to be coupled to a ground,
  the at least one load circuit configured to be connected to the first supply voltage node for at least a portion of time.

Aspect 2: The apparatus of aspect 1, wherein the at least one load circuit is configured to controllably adjust a magnitude of a supply voltage provided by the first supply voltage node.

Aspect 3: The apparatus of aspect 2, wherein the at least one load circuit is configured to adjust the magnitude of the supply voltage between approximately 1 and 10 millivolts.

Aspect 4: The apparatus any preceding aspect, wherein the at least one load circuit is configured to be disconnected from the multiple clients configured to receive the clock signal or a signal based on the clock signal.

Aspect 5: The apparatus of aspect 4, wherein the at least one load circuit is not directly connected to the multiple clients.

Aspect 6: The apparatus of aspect 4, wherein the at least one load circuit is configured to selectively be in:
  the disabled state; or
  the enabled state to adjust a supply voltage of the supply voltage node.

Aspect 7: The apparatus of aspect 1, wherein the at least one clock buffer and the at least one load circuit are configured to selectively be in the disabled state or the enabled state together.

Aspect 8: The apparatus of any one of aspects 1-3, wherein:
  the at least one clock buffer comprises a first clock buffer;
  the at least one load circuit comprises a second clock buffer; and
  the apparatus further comprises a switch circuit configured to selectively:
    connect the second clock buffer to the first supply voltage node and disconnect an output of the second clock buffer from an output node; or
    connect the second clock buffer to the second supply voltage node and connect the output of the second clock buffer to the output node.

Aspect 9: The apparatus of aspect 8, wherein the switch circuit comprises:
  a first switch coupled between the second clock buffer, the first supply voltage node, and the second supply voltage node; and
  a second switch coupled between the output of the second clock buffer and the output node.

Aspect 10: The apparatus of any preceding aspect, wherein the at least one load circuit comprises:
  at least one buffer having an input coupled to the output of the oscillator circuit; and
  at least one capacitor coupled between an output of the at least one buffer and the ground.

Aspect 11: The apparatus of aspect 10, wherein the at least one load circuit comprises at least one frequency divider circuit coupled between the output of the oscillator circuit and the input of the at least one buffer.

Aspect 12: The apparatus of aspect 10 or 11, wherein:
  the at least one buffer comprises multiple buffers implemented in parallel; and
  the at least one load circuit is configured to enable different portions of the multiple buffers to adjust a supply voltage of the first supply voltage node by different amounts.

Aspect 13: The apparatus of any one of aspects 10-14, wherein:
  the at least one capacitor comprises a trimming capacitor having a variable capacitance; and
  the at least one load circuit is configured to adjust the variable capacitance of the trimming capacitor to adjust a supply voltage of the first supply voltage node by different amounts.

Aspect 14: The apparatus of any preceding aspect, wherein the oscillator circuit comprises a single resonator.

Aspect 15: The apparatus of aspect 14, wherein the single resonator comprises a quartz crystal.

Aspect 16: The apparatus of any preceding aspect, further comprising:
  an integrated circuit comprising:
    the at least one load circuit;
    the at least one clock buffer;
    at least a portion of the oscillator circuit; and
    multiple output nodes configured to be connected to the multiple clients, respectively.

Aspect 17: The apparatus of aspect 16, further comprising:
  a printed circuit board,
  wherein the oscillator circuit comprises a resonator that is implemented on the printed circuit board and coupled to the integrated circuit.

Aspect 18: An apparatus comprising:
  supply means for providing a supply voltage;
  oscillation means for generating a clock signal using the supply voltage; and
  stabilization means for adjusting an average of the supply voltage by a particular amount, the stabilization means coupled to the oscillation means, the supply means, and a ground.

Aspect 19: The apparatus of aspect 18, further comprising:
  buffer means for selectively isolating the oscillation means from at least one client according to a disabled state or passing the clock signal to the at least one client according to an enabled state,
  wherein the stabilization means is configured to adjust the average of the supply voltage based on the buffer means being in the enabled state.

Aspect 20: The apparatus of aspect 18 or 19, wherein the stabilization means comprises:
  means for drawing current from the supply means during a portion of a period of the clock signal; and
  capacitive means for controlling an amount of the current that is drawn from the supply means.

Aspect 21: A method comprising:
  generating a clock signal using a supply voltage;
  passing the clock signal to different sets of clients, the different sets of clients associated with different loading conditions; and
  adjusting an average of the supply voltage by different amounts based on the different loading conditions.

Aspect 22: The method of aspect 21, wherein the adjusting the average of the supply voltage is effective to substantially stabilize a frequency of the clock signal during the different loading conditions.

Aspect 23: The method of aspect 21 or 22, wherein the adjusting the average of the supply voltage comprises enabling at least one load circuit to draw power from the supply voltage.

Aspect 24: The method of aspect 23, wherein the adjusting the average of the supply voltage comprises adjusting an amount of current the at least one load circuit draws from the supply voltage and routes to a ground.

Aspect 25: An apparatus comprising:
multiple clients, each client of the multiple clients configured to:
selectively be in an enabled state or a disabled state; and
accept a clock signal in accordance with the enabled state; and
a clock generator coupled to the multiple clients and configured to generate the clock signal having a frequency that remains substantially stable responsive to providing the clock signal to a first set of the multiple clients that are in the enabled state during a first time interval and a second set of the multiple clients that are in the enabled state during a second time interval.

Aspect 26: The apparatus of aspect 25, wherein the clock generator comprises:
a supply voltage node configured to provide a supply voltage;
an oscillator circuit coupled to the supply voltage node, the oscillator circuit configured to generate the clock signal using the supply voltage;
at least one clock buffer coupled to an output of the oscillator circuit, the at least one clock buffer configured to:
pass the clock signal to the first set of the multiple clients during the first time interval; and
pass the clock signal to the second set of the multiple clients during the second time interval; and
at least one frequency stabilization circuit coupled to the output of the oscillator circuit and the supply voltage node, the at least one frequency stabilization circuit configured to adjust the supply voltage during at least a portion of a period of the clock signal to stabilize the frequency of the clock signal for the first set of the multiple clients and the second set of the multiple clients.

Aspect 27: The apparatus of aspect 26, wherein:
the at least one frequency stabilization circuit comprises a frequency divider circuit configured to generate a modified clock signal having a period that is different from the period of the clock signal; and
the at least one frequency stabilization circuit is configured to adjust the supply voltage during at least a portion of the period of the modified clock signal.

Aspect 28: The apparatus of aspect 26 or 27, wherein the at least one frequency stabilization circuit is configured to:
adjust the supply voltage by a first amount during at least the portion of each period of the clock signal during the first time interval based on the clock signal being provided to the first set of the multiple clients; and
adjust the supply voltage by a second amount during at least the portion of each period of the clock signal during the second time interval based on the clock signal being provided to the second set of the multiple clients.

Aspect 29: The apparatus of aspect 25, wherein the clock generator comprises:
a supply voltage node configured to provide a supply voltage;
an oscillator circuit coupled to the supply voltage node, the oscillator circuit configured to generate the clock signal using the supply voltage;
at least one clock buffer coupled to an output of the oscillator circuit, the at least one clock buffer configured to selectively:
pass the clock signal to the first set of the multiple clients during the first time interval; or adjust the supply voltage during at least a portion of a period of the clock signal to stabilize the frequency of the clock signal during the second time interval; and
a switch circuit configured to selectively:
connect the at least one clock buffer to another supply voltage node and connect an output of the at least one clock buffer to the first set of the multiple clients during the first time interval; or
connect the at least one clock buffer to the supply voltage node and disconnect the output of the at least one clock buffer from the first set of the multiple clients during the second time interval.

Aspect 30: The apparatus of any one of aspects 25-29, wherein the multiple clients comprise at least two different clients selected from the following group:
a cellular transceiver;
a Global Navigation Satellite System (GNSS) circuit;
a Wi-Fi® transceiver; and
a near-field communication (NFC) transceiver.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
a first supply voltage node;
a second supply voltage node;
an oscillator circuit coupled to the first supply voltage node and configured to generate a clock signal;
at least one clock buffer coupled to the second supply voltage node and an output of the oscillator circuit, the at least one clock buffer configured to selectively be in:
a disabled state; or
an enabled state to pass the clock signal to at least one client of multiple clients; and
at least one load circuit comprising:
an input coupled to the output of the oscillator circuit; and
an output configured to be coupled to a ground, the at least one load circuit configured to:
be connected to the first supply voltage node for at least a portion of time; and
controllably adjust a magnitude of a supply voltage provided by the first supply voltage node.

2. The apparatus of claim 1, wherein the at least one load circuit is configured to adjust the magnitude of the supply voltage between approximately 1 and 10 millivolts.

3. The apparatus of claim 1, wherein:
the at least one load circuit is configured to be disconnected from the multiple clients configured to receive the clock signal or a signal based on the clock signal; and the at least one load circuit is not directly connected to the multiple clients.

4. The apparatus of claim 1, wherein the at least one load circuit is configured to:
be disconnected from the multiple clients configured to receive the clock signal or a signal based on the clock signal; and
selectively be in:
the disabled state; or
the enabled state to adjust the supply voltage of the first supply voltage node.

5. The apparatus of claim 1, wherein the at least one clock buffer and the at least one load circuit are configured to selectively be in the disabled state or the enabled state together.

6. The apparatus of claim 1, wherein:
the at least one clock buffer comprises a first clock buffer;
the at least one load circuit comprises a second clock buffer; and
the apparatus further comprises a switch circuit configured to selectively:
connect the second clock buffer to the first supply voltage node and disconnect an output of the second clock buffer from an output node; or
connect the second clock buffer to the second supply voltage node and connect the output of the second clock buffer to the output node.

7. The apparatus of claim 6, wherein the switch circuit comprises:
a first switch coupled between the second clock buffer, the first supply voltage node, and the second supply voltage node; and
a second switch coupled between the output of the second clock buffer and the output node.

8. The apparatus of claim 1, wherein the at least one load circuit comprises:
at least one buffer having an input coupled to the output of the oscillator circuit;
at least one capacitor coupled between an output of the at least one buffer and the ground; and
at least one frequency divider circuit coupled between the output of the oscillator circuit and the input of the at least one buffer.

9. The apparatus of claim 1, wherein:
the at least one load circuit comprises:
at least one buffer having an input coupled to the output of the oscillator circuit; and
at least one capacitor coupled between an output of the at least one buffer and the ground;
the at least one buffer comprises multiple buffers implemented in parallel; and
the at least one load circuit is configured to enable different portions of the multiple buffers to adjust the supply voltage of the first supply voltage node by different amounts.

10. The apparatus of claim 1, wherein:
the at least one load circuit comprises:
at least one buffer having an input coupled to the output of the oscillator circuit; and
at least one capacitor coupled between an output of the at least one buffer and the ground;
the at least one capacitor comprises a trimming capacitor having a variable capacitance; and
the at least one load circuit is configured to adjust the variable capacitance of the trimming capacitor to adjust the supply voltage of the first supply voltage node by different amounts.

11. The apparatus of claim 1, wherein the oscillator circuit comprises a single resonator.

12. The apparatus of claim 11, wherein the single resonator comprises a quartz crystal.

13. The apparatus of claim 1, further comprising:
an integrated circuit, the integrated circuit comprising:
the at least one load circuit;
the at least one clock buffer;
at least a portion of the oscillator circuit; and
multiple output nodes configured to be connected to the multiple clients, respectively.

14. The apparatus of claim 13, further comprising:
a printed circuit board,
wherein the oscillator circuit comprises a resonator that is implemented on the printed circuit board and coupled to the integrated circuit.

15. An apparatus comprising:
supply means for providing a supply voltage;
oscillation means for generating a clock signal using the supply voltage; and
stabilization means for drawing current from the supply means during a portion of a period of the clock signal to adjusting adjust a magnitude of the supply voltage provided by the supply means by a particular amount, the stabilization means coupled to the oscillation means, the supply means, and a ground.

16. The apparatus of claim 15, further comprising:
buffer means for selectively isolating the oscillation means from at least one client according to a disabled state or passing the clock signal to the at least one client according to an enabled state,
wherein the stabilization means is configured to adjust the magnitude of the supply voltage based on the buffer means being in the enabled state.

17. The apparatus of claim 15, wherein the stabilization means comprises:
means for drawing current from the supply means during a portion of a period of the clock signal; and
capacitive means for controlling an amount of the current that is drawn from the supply means.

18. A method comprising:
generating a clock signal using a supply voltage;
passing the clock signal to different sets of clients, the different sets of clients associated with different loading conditions;
adjusting an average of the supply voltage by different amounts based on the different loading conditions; and
enabling at least one load circuit to draw power from the supply voltage to adjust the average of the supply voltage.

19. The method of claim 18, wherein the adjusting the average of the supply voltage is effective to substantially stabilize a frequency of the clock signal during the different loading conditions.

20. The method of claim 18, wherein the adjusting the average of the supply voltage comprises adjusting an amount of current the at least one load circuit draws from the supply voltage and routes to a ground.

21. An apparatus comprising:
multiple clients, each client of the multiple clients configured to:
selectively be in an enabled state or a disabled state; and
accept a clock signal in accordance with the enabled state; and
a clock generator coupled to the multiple clients and configured to generate the clock signal having a frequency that remains substantially stable responsive to providing the clock signal to a first set of the multiple clients that are in the enabled state during a first time interval and a second set of the multiple clients that are in the enabled state during a second time interval.

22. The apparatus of claim 21, wherein the clock generator comprises:
a supply voltage node configured to provide a supply voltage;
an oscillator circuit coupled to the supply voltage node, the oscillator circuit configured to generate the clock signal using the supply voltage;
at least one clock buffer coupled to an output of the oscillator circuit, the at least one clock buffer configured to:
pass the clock signal to the first set of the multiple clients during the first time interval; and
pass the clock signal to the second set of the multiple clients during the second time interval; and
at least one frequency stabilization circuit coupled to the output of the oscillator circuit and the supply voltage node, the at least one frequency stabilization circuit configured to adjust the supply voltage during at least a portion of a period of the clock signal to stabilize the frequency of the clock signal for the first set of the multiple clients and the second set of the multiple clients.

23. The apparatus of claim 22, wherein:
the at least one frequency stabilization circuit comprises a frequency divider circuit configured to generate a modified clock signal having a period that is different from the period of the clock signal; and
the at least one frequency stabilization circuit is configured to adjust the supply voltage during at least a portion of the period of the modified clock signal.

24. The apparatus of claim 22, wherein the at least one frequency stabilization circuit is configured to:
adjust the supply voltage by a first amount during at least the portion of each period of the clock signal during the first time interval based on the clock signal being provided to the first set of the multiple clients; and
adjust the supply voltage by a second amount during at least the portion of each period of the clock signal during the second time interval based on the clock signal being provided to the second set of the multiple clients.

25. The apparatus of claim 21, wherein the clock generator comprises:
a supply voltage node configured to provide a supply voltage;
an oscillator circuit coupled to the supply voltage node, the oscillator circuit configured to generate the clock signal using the supply voltage;
at least one clock buffer coupled to an output of the oscillator circuit, the at least one clock buffer configured to selectively:
pass the clock signal to the first set of the multiple clients during the first time interval; or
adjust the supply voltage during at least a portion of a period of the clock signal to stabilize the frequency of the clock signal during the second time interval; and
a switch circuit configured to selectively:

connect the at least one clock buffer to another supply voltage node and connect an output of the at least one clock buffer to the first set of the multiple clients during the first time interval; or
connect the at least one clock buffer to the supply voltage node and disconnect the output of the at least one clock buffer from the first set of the multiple clients during the second time interval.

26. The apparatus of claim 21, wherein the multiple clients comprise at least two different clients selected from the following group:
a cellular transceiver;
a Global Navigation Satellite System (GNSS) circuit;
a Wi-Fi® transceiver; and
a near-field communication (NFC) transceiver.

27. The apparatus of claim 15, wherein the stabilization means is configured to adjust the magnitude of the supply voltage between approximately 1 and 10 millivolts.

28. The apparatus of claim 15, wherein the stabilization means is configured to draw power from the supply voltage to adjust the magnitude of the supply voltage.

29. An apparatus comprising:
a first supply voltage node;
a second supply voltage node;
an oscillator circuit coupled to the first supply voltage node and configured to generate a clock signal;
at least one clock buffer coupled to the second supply voltage node and an output of the oscillator circuit, the at least one clock buffer configured to selectively be in:
a disabled state; or
an enabled state to pass the clock signal to at least one client of multiple clients; and
at least one load circuit comprising:
an input coupled to the output of the oscillator circuit; and
an output configured to be coupled to a ground, the at least one load circuit configured to:
be connected to the first supply voltage node for at least a portion of time; and
be disconnected from the multiple clients configured to receive the clock signal or a signal based on the clock signal.

30. An apparatus comprising:
a first supply voltage node;
a second supply voltage node;
an oscillator circuit coupled to the first supply voltage node and configured to generate a clock signal;
at least one clock buffer coupled to the second supply voltage node and an output of the oscillator circuit, the at least one clock buffer configured to selectively be in:
a disabled state; or
an enabled state to pass the clock signal to at least one client of multiple clients; and
at least one load circuit comprising:
an input coupled to the output of the oscillator circuit;
an output configured to be coupled to a ground;
at least one buffer having an input coupled to the output of the oscillator circuit; and
at least one capacitor coupled between an output of the at least one buffer and the ground,
the at least one load circuit configured to be connected to the first supply voltage node for at least a portion of time.

* * * * *